United States Patent
Ru et al.

(10) Patent No.: US 12,411,158 B2
(45) Date of Patent: Sep. 9, 2025

(54) FREQUENCY DOMAIN RESAMPLING OF TIME SERIES SIGNALS

(71) Applicant: ORACLE INTERNATIONAL CORPORATION, Redwood Shores, CA (US)

(72) Inventors: Keyang Ru, Kirkland, WA (US); Ruixian Liu, San Diego, CA (US); Kenny C. Gross, Escondido, CA (US); Guang Chao Wang, San Diego, CA (US)

(73) Assignee: Oracle International Corporation, Redwood Shores, CA (US)

( * ) Notice: Subject to any disclaimer, the term of this patent is extended or adjusted under 35 U.S.C. 154(b) by 321 days.

(21) Appl. No.: 18/094,509

(22) Filed: Jan. 9, 2023

(65) Prior Publication Data

US 2024/0230733 A1    Jul. 11, 2024

(51) Int. Cl.
  *G01R 21/133*   (2006.01)
  *G01R 23/16*    (2006.01)

(52) U.S. Cl.
  CPC ........... *G01R 21/133* (2013.01); *G01R 23/16* (2013.01)

(58) Field of Classification Search
  CPC ........ G01R 21/133; G01R 23/16; G06F 17/14
  USPC .......................................................... 702/61
  See application file for complete search history.

(56) References Cited

U.S. PATENT DOCUMENTS

| | | |
|---|---|---|
| 4,686,655 A | 8/1987 | Hyatt |
| 7,020,802 B2 | 3/2006 | Gross et al. |
| 7,191,096 B1 | 3/2007 | Gross et al. |
| 7,281,112 B1 | 10/2007 | Gross et al. |
| 7,292,659 B1 | 11/2007 | Gross et al. |
| 7,391,835 B1 | 6/2008 | Gross et al. |
| 7,542,995 B2 | 6/2009 | Thampy et al. |
| 7,573,952 B1 | 8/2009 | Thampy et al. |

(Continued)

FOREIGN PATENT DOCUMENTS

DE    4447288 A1    7/1995

OTHER PUBLICATIONS

Kameoka Hirokazu et al., JP 2010197596 A, "Signal Analysis Device, Signal Analysis Method, Program, and Recording Medium", Date published: Sep. 9, 2010 (Year: 2010).*

(Continued)

*Primary Examiner* — John H Le
(74) *Attorney, Agent, or Firm* — Kraguljac Law Group LLC

(57) ABSTRACT

Systems, methods, and other embodiments associated with frequency-domain resampling of time series are described. An example method includes generating a power spectrum for a first time series signal that is sampled inconsistently with a target sampling rate. Prominent frequencies are selected from the power spectrum. Sets of first phase factors that map the prominent frequencies to a frequency domain at first time points are generated. Coefficients are identified that relate the sets of first phase factors to values of the first time series signal at the first time points. Sets of second phase factors that map the prominent frequencies to a frequency domain at second time points are generated. A second time series signal that is resampled at the target sampling rate is generated by generating new values at the second time points from the coefficients and sets of second phase factors.

20 Claims, 5 Drawing Sheets

(56) References Cited

U.S. PATENT DOCUMENTS

| | | |
|---|---|---|
| 7,613,576 B2 | 11/2009 | Gross et al. |
| 7,613,580 B2 | 11/2009 | Gross et al. |
| 7,702,485 B2 | 4/2010 | Gross et al. |
| 7,869,977 B2 | 1/2011 | Lewis et al. |
| 8,055,594 B2 | 11/2011 | Dhanekula et al. |
| 8,069,490 B2 | 11/2011 | Gross et al. |
| 8,150,655 B2 | 4/2012 | Dhanekula et al. |
| 8,200,991 B2 | 6/2012 | Vaidyanathan et al. |
| 8,214,682 B2 | 7/2012 | Vaidyanathan et al. |
| 8,275,738 B2 | 9/2012 | Gross et al. |
| 8,341,759 B2 | 12/2012 | Gross et al. |
| 8,365,003 B2 | 1/2013 | Gross et al. |
| 8,457,913 B2 | 6/2013 | Zwinger et al. |
| 8,543,346 B2 | 9/2013 | Gross et al. |
| 8,706,451 B1 | 4/2014 | Gross et al. |
| 9,514,213 B2 | 12/2016 | Wood et al. |
| 9,933,338 B2 | 4/2018 | Noda et al. |
| 10,015,139 B2 | 7/2018 | Gross et al. |
| 10,452,510 B2 | 10/2019 | Gross et al. |
| 10,496,084 B2 | 12/2019 | Li et al. |
| 10,860,011 B2 | 12/2020 | Gross et al. |
| 10,929,776 B2 | 2/2021 | Gross et al. |
| 11,042,428 B2 | 6/2021 | Gross et al. |
| 11,055,396 B2 | 7/2021 | Gross et al. |
| 11,255,894 B2 | 2/2022 | Wetherbee et al. |
| 11,392,786 B2 | 7/2022 | Gross et al. |
| 2003/0061008 A1 | 3/2003 | Smith et al. |
| 2008/0140362 A1 | 6/2008 | Gross et al. |
| 2008/0252309 A1 | 10/2008 | Gross et al. |
| 2008/0252441 A1 | 10/2008 | McElfresh et al. |
| 2008/0256398 A1 | 10/2008 | Gross et al. |
| 2009/0099830 A1 | 4/2009 | Gross et al. |
| 2009/0125467 A1 | 5/2009 | Dhanekula et al. |
| 2009/0306920 A1 | 12/2009 | Zwinger et al. |
| 2010/0023282 A1 | 1/2010 | Lewis et al. |
| 2010/0033386 A1 | 2/2010 | Lewis et al. |
| 2010/0161525 A1 | 6/2010 | Gross et al. |
| 2010/0305892 A1 | 12/2010 | Gross et al. |
| 2010/0306165 A1 | 12/2010 | Gross et al. |
| 2012/0030775 A1 | 2/2012 | Gross et al. |
| 2016/0098561 A1 | 4/2016 | Keller, III et al. |
| 2017/0163669 A1 | 6/2017 | Brown et al. |
| 2018/0349797 A1 | 12/2018 | Garvey et al. |
| 2019/0102718 A1 | 4/2019 | Agrawal |
| 2019/0163719 A1 | 5/2019 | Gross et al. |
| 2019/0196892 A1 | 6/2019 | Matei et al. |
| 2019/0197145 A1 | 6/2019 | Gross et al. |
| 2019/0237997 A1 | 8/2019 | Tsujii et al. |
| 2019/0243799 A1 | 8/2019 | Gross et al. |
| 2019/0286725 A1 | 9/2019 | Gawlick et al. |
| 2019/0324430 A1 | 10/2019 | Herzog et al. |
| 2019/0378022 A1 | 12/2019 | Wang et al. |
| 2020/0125819 A1 | 4/2020 | Gross et al. |
| 2020/0144204 A1 | 5/2020 | Keller, III et al. |
| 2020/0201950 A1 | 6/2020 | Wang et al. |
| 2021/0081573 A1 | 3/2021 | Gross et al. |
| 2021/0158202 A1 | 5/2021 | Backlawski et al. |
| 2021/0174248 A1 | 6/2021 | Wetherbee et al. |
| 2021/0270884 A1 | 9/2021 | Wetherbee et al. |
| 2022/0121955 A1 | 4/2022 | Chavoshi et al. |

OTHER PUBLICATIONS

Gross, Kenny, Oracle Labs; MSET2 Overview: "Anomaly Detection and Prediction" Oracle Cloud Autonomous Prognostics; p. 1-58; Aug. 8, 2019.

Gross, K. C. et al., "Application of a Model-Based Fault Detection System to Nuclear Plant Signals," downloaded from https://www.researchgate.net/publication/236463759; Conference Paper: May 1, 1997, 5 pages.

Verma, Guarav et al., "A Lexical, Syntactic, and Semantic Perspective for Understanding Style in Text," Sep. 18, 2019; pp. 1-9; BigData Experience Lab, Adobe Research, India.

Jacob T. Vanderplas; Understanding the Lomb-Scargle Periodogram; The Astrophysical Journal Supplement Series, 236:16 (28 pp), published May 11, 2018; University of Washington, eScience Institute, Seattle WA.

Wikipedia; Least-Squares Spectral Analysis; pp. 1-5; last edited May 16, 2022.

Steven W. Smith, Ph.D.; Chapter 8, The Discrete Fourier Transform; The Scientist and Engineer's Guide to Digital Signal Processing; pp. 1-28; downloaded on Oct. 21, 2022 from: https://www.dspguide.com.

Bouali Fatma et al. "Visual mining of time series using a tubular visualization," Visual Computer, Springer, Berlin, DE, vol. 32, No. 1, Dec. 5, 2014 (Dec. 5, 2014), pp. 15-30.

Dickey et al.; Checking for Autocorrelation in Regression Residuals; pp. 959-965; Proceedings of 11th Annual SAS Users Group International Conference; 1986.

Hoyer et al.; Spectral Decomposition and Reconstruction of Nuclear Plant Signals; pp. 1153-1158; published Jan. 1, 2005; downloaded on Jul. 14, 2021 from: https://support.sas.com/resources/papers/proceedings-archive/SUGI93/Sugi-93-193%20Hoyer%20Gross.pdf.

Whisnant et al.; "Proactive Fault Monitoring in Enterprise Servers," IEEE—International Multiconference in Computer Science & Computer Engineering (Jun. 27-30, 2005) 11 pgs.

US Nuclear Regulatory Commission; "Technical Review of On-Line Monitoring Techniques for Performance Assessment," vol. 1, Jan. 31, 2006.

Gribok, et al,. "Use of Kernel Based Techniques for Sensor Validation in Nuclear Power Plants," International Topical Meeting on Nuclear Plant Instrumentation, Controls, and Human-Machine Interface Technologies (NPIC & HMIT 2000), Washington, DC, Nov. 2000, pp. 1-15.

Singer, et al., "Model-Based Nuclear Power Plant Monitoring and Fault Detection: Theoretical Foundations," Intelligent System Application to Power Systems (ISAP '97), Jul. 6-10, 1997, Seoul, Korea pp. 60-65.

Wald, A, "Sequential Probability Ratio Test for Reliability Demonstration", John Wiley & Sons, 1947.

Seyerlehner, et al.: "Frame Level Audio Similarity—A Codebook Approach", Proc. of the 11th Int. Conference on Digital Audio Effects (DAFx-08), Espoo, Finland, Sep. 1-4, 2008, pp. 1-8.

Abebe Diro et al.; A Comprehensive Study of Anomaly Detection Schemes in IoT Networks Using Machine Learning Algorithms; pp. 1-13; 2021; downloaded from: https://doi.org/10.3390/s21248320.

Zhenlong Xiao, et al.; Anomalous IoT Sensor Data Detection: An Efficient Approach Enabled by Nonlinear Frequency-Domain Graph Analysis; IEEE Internet of Things Journal, Aug. 2020; pp. 1-11.

Choi Kukjin et al: "Deep Learning for Anomaly Detection in Time-Series Data: Review, Analysis, and Guidelines", IEEE Access, IEEE, USA, vol. 9, Aug. 26, 2021, (23 pgs).

Gross Kenny et al: "AI Decision Support Prognostics for IoT Asset Health Monitoring, Failure Prediction, Time to Failure", 2019 International Conference on Computational Science and Computational Intelligence (CSCI), IEEE, Dec. 5, 2019, pp. 244-248.

Seilmayer, Martin et al.: "A Guide on Spectral Methods Applied to Discrete Data—Part I: One-Dimensional Signals", arXiv .org, Dec. 22, 2016, 46 pgs.

Harma A. et al.: "Frequency-Warped Signal Processing for Audio Applications", Journal of the Audio Engineering Society, New York, NY, US [Online] vol. 48, No. 11, Nov. 1, 2000, 20 pgs.

Karjalainen, Matti et al.: "Modal Equalization by Temporal Shaping of Room Response", AES, 60 East 42nd Street, Room 2520, New York 0165-2520, USA, [Online] May 23, 2003, 11 pgs.

Horne James H. et al.: "A Prescription for Period Analysis of Unevenly Sampled Time Series", Astrophysical Journal, [Online] vol. 302, Mar. 15, 1986, 7 pgs.

Patent Cooperation Treaty (PCT), International Search Report and Written Opinion, issued in PCT International Patent Application No. PCT/US2023/082224, International Filing Date Dec. 4, 2023, having a Date of Mailing of Mar. 26, 2024 14 pgs.

* cited by examiner

FREQUENCY DOMAIN RESAMPLING OF TIME SERIES SIGNALS

BACKGROUND

Time series signals sampled from sensors can be used for proactive detection of incipient equipment failures. Sampling rates may differ from sensor to sensor, and samples may be taken at irregular intervals.

BRIEF DESCRIPTION OF THE DRAWINGS

The accompanying drawings, which are incorporated in and constitute a part of the specification, illustrate various systems, methods, and other embodiments of the disclosure. It will be appreciated that the illustrated element boundaries (e.g., boxes, groups of boxes, or other shapes) in the figures represent one embodiment of the boundaries. In some embodiments one element may be implemented as multiple elements or that multiple elements may be implemented as one element. In some embodiments, an element shown as an internal component of another element may be implemented as an external component and vice versa. Furthermore, elements may not be drawn to scale.

DETAILED DESCRIPTION

Figure 1:
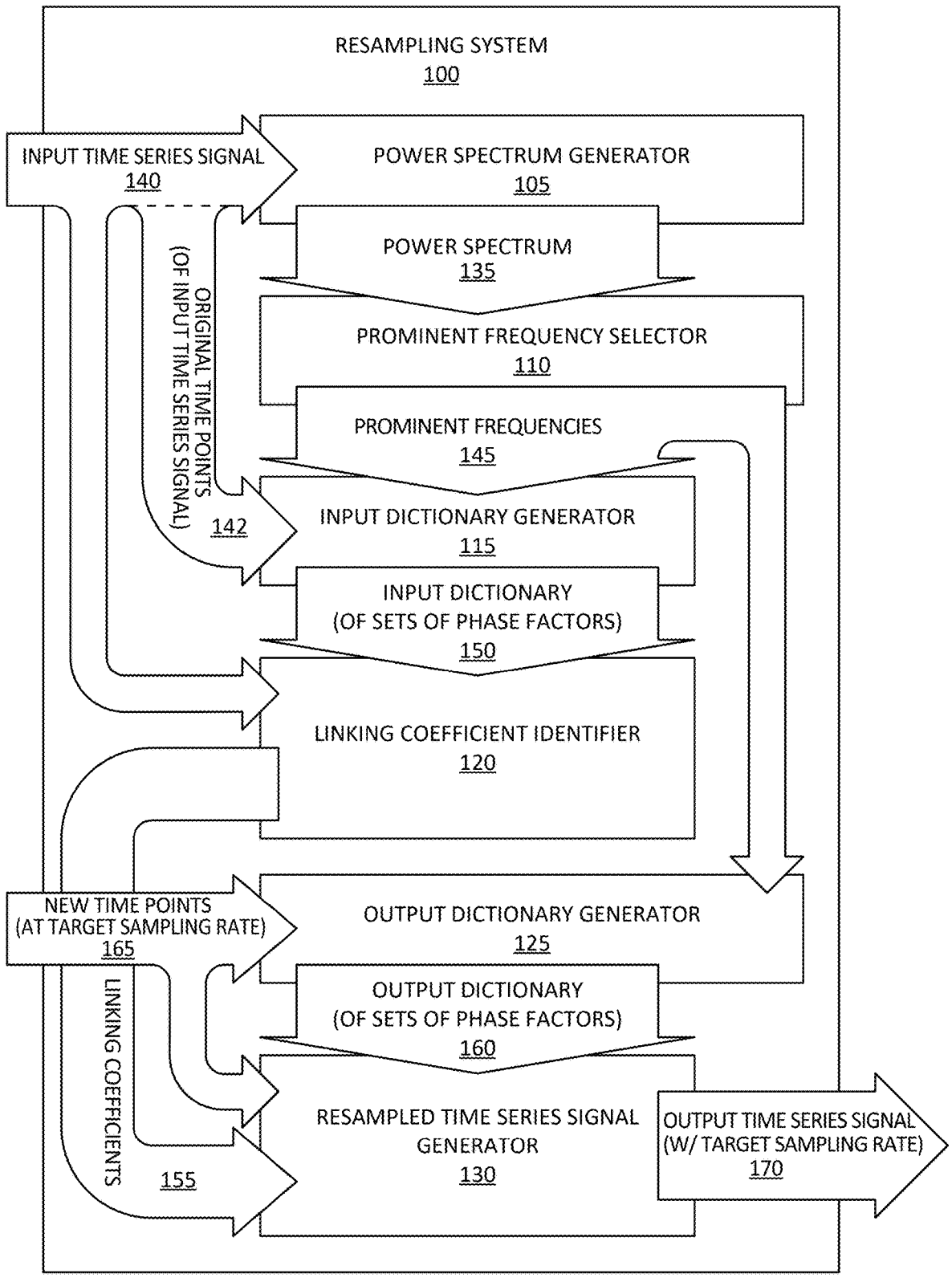
FIG. 1 illustrates one embodiment of a frequency-domain resampling system associated with analytical resampling of time series signals in the frequency domain.

Systems, methods, and other embodiments are described herein that provide frequency-domain analytical resampling of time series for multivariate anomaly detection with accuracy enhancement. In one embodiment, a frequency-domain resampling system interpolates time series signals from a frequency domain representation rather than a time domain representation. For example, the frequency-domain resampling system resamples a time series signal to a target sampling rate using frequency domain transforms.

In one embodiment, the frequency-domain resampling system operates in the frequency domain to produce time series with a target sampling rate without converting the original time series signals in the time domain. In one embodiment, resampling from the frequency domain eliminates significant compute overhead consumed by performing interpolation in the time domain. In one embodiment, resampling from the frequency domain improves accuracy in the resulting resampled signals over those produced by interpolation in the time domain. These and other improvements to the technology of resampling or interpolation in time series signals are discussed in more detail herein.

In one embodiment, the frequency-domain resampling system generates a power spectrum (such as a periodogram or a power spectral density (PSD) curve) that indicates frequencies that are components of a time series signal as peaks in the curve. The input time series signal is sampled at intervals other than those of a target sampling rate. The frequency-domain resampling system then selects one or more of prominent frequencies that have highest peaks in the power spectrum as representative of the non-noise informational content of the time series signal. The frequency-domain resampling system then builds a dictionary of sets of phase factors that map time points of the time series signal into the frequency domain for each of the selected prominent frequencies. The frequency-domain resampling system then identifies the coefficients that link the sets of phase factors with the values of the time series signal at the time points. The frequency-domain resampling system then builds a second dictionary of phase factors that map new time points (that occur at intervals of the target sampling rate) of a new time series signal into the frequency domain for each of the selected prominent frequencies. The frequency-domain resampling system then generates the new time series signal from the coefficients and the new time points, resulting in a time series signal that has values sampled at intervals of the target sampling rate.

Definitions

As used herein, the term "frequency domain" refers to the description of signals in terms of frequency, rather than time. For example, a plot of a time series signal in the frequency domain shows how much power (amplitude) of the time series signal is present at a given frequency.

As used herein, the term "time domain" refers to the description of signals in terms of time, rather than of frequency. For example, a plot of a time series signal in the time domain shows how much power (or amplitude) of the time series signal is present at a given time.

As used herein, the term "time series signal" refers to a data structure in which a series of data points (such as observations or sampled values) are indexed in time order. In one embodiment, the data points of a time series signal may be indexed with a time stamp, also referred to herein as a time point. In one embodiment, time points of a time series signal recur at regular or even intervals that are spaced apart in time by one amount of time. In other words, the time series signal has a sampling rate. In one embodiment, time points of a time series recur at irregular or uneven intervals that are spaced apart in time by differing amounts of time. As discussed in further detail herein, a time series signal with data points at one set of time points may be resampled to have new data points at a set of new time points. In one embodiment, multiple time series signals may have uniform time points or a uniform sampling rate shared across the multiple time series signals. In one embodiment, multiple time series signals may have non-uniform time points or non-uniform sampling rates that are not shared across the multiple time series signals.

As used herein, the term "time series database" refers to a data structure that includes one or more time-series signals sharing an index (such as a series of time stamps or time points) in common.

As used herein, the term "residual" refers to the difference between a value (such as a sampled or resampled value) and an ML prediction or ML estimate of what the value is expected to be by an ML model. Thus, a residual time series signal refers to a time series of residual values between a time series of actual values and a time series of ML estimates for the values.

References herein to "complex" numbers (such as complex coefficients and complex factors) indicate those numbers that have a real component and an imaginary component. A complex number is expressible in the form a+bj, where a and b are real numbers, and j is the imaginary unit $\sqrt{-1}$.

—Example Frequency-Domain Resampling System—

FIG. 1 illustrates one embodiment of a frequency-domain resampling system 100 associated with analytical resampling of time series signals in the frequency domain. Frequency-domain resampling system 100 includes a power spectrum generator 105, a prominent frequency selector 110, an input dictionary generator 115, a linking coefficient identifier 120, an output dictionary generator 125, and a resampled time series signal generator 130. These components are discussed initially at a high-level with reference to FIG. 1, and are discussed in further detail elsewhere herein.

In one embodiment, power spectrum generator 105 is configured to generate a power spectrum 135 for an input time series signal 140. The input time series signal 140 is sampled at original time points 142. Original time points 142 are inconsistent with a target sampling rate. The input time series signal may be received or retrieved from a time series database, or as a stream of live data from sensors. In one example, the power spectrum 135 may be a periodogram such as a Lomb-Scargle periodogram. Power spectrum generator 105 is also configured to provide the generated power spectrum 135 to prominent frequency selector 110.

In one embodiment, prominent frequency selector 110 is configured to select one or more prominent frequencies 145 from the power spectrum 135. For example, prominent frequency selector 110 may be configured to identify peaks in the power spectrum 135, rank the peaks in order of height, identify a subset of the peaks that are highest, and determine the respective frequency of the highest peaks. Prominent frequency selector 110 is also configured to provide the selected prominent frequencies 145 to input dictionary generator 115.

In one embodiment, input dictionary generator 115 is configured to generate an input dictionary 150 of one or more sets of phase factors from the prominent frequencies 145. A set of phase factors may also be referred to herein as an "atom." In one embodiment, each set of phase factors maps one of the prominent frequencies 145 into the frequency domain at the original time points 142. In one embodiment, input dictionary generator 115 is configured to, for each of the prominent frequencies 145, generate a set of phase factors that map the prominent frequency into the frequency domain at the original time points 142. Input dictionary generator 115 is configured to include sets of phase factors for each prominent frequency in input dictionary 150. Input dictionary generator 115 is also configured to provide the generated input dictionary 150 to linking coefficient identifier 120.

In one embodiment, linking coefficient identifier 120 is configured to identify linking coefficients 155 that link the sets of first phase factors in the input dictionary 150 with values of the first time series signal 140 at the original time points 142. In one embodiment, linking coefficient identifier 120 is configured to, for each of the prominent frequencies 145, identify a linking coefficient 155 that links the set of phase factors for that frequency with values of the input time series signal 140 at the original time points 142. Linking coefficient identifier 120 is also configured to provide the identified linking coefficients 155 to output dictionary generator 125.

In one embodiment, output dictionary generator 125 is configured to generate an output dictionary 160 of sets of second phase factors from the prominent frequencies 145 and new (second) time points 165. In one embodiment, the new time points 165 are consistent with the target sampling rate. In one embodiment, each of the sets of second phase factors in the output dictionary 160 maps one of the prominent frequencies 145 into the frequency domain at the new time points 165. In one embodiment, output dictionary generator 125 is configured to, for each of the prominent frequencies 145, generate an output (or second) set of phase factors that map the prominent frequency into the frequency domain at the new (or second) time points 165. Output dictionary generator 125 is also configured to provide output dictionary 160 to resampled time series signal generator 130.

In one embodiment, a resampled time series signal generator 130 is configured to generate an output (or second) time series signal 170. Output time series signal 170 is sampled at the target sampling rate. Output time series signal 170 is generated based on multiplying the linking coefficients 155 and sets of second phase factors in the output dictionary 160 to produce new values at the new time points 165. Thus, in one embodiment, resampled time series signal generator 130 is configured to generate an output time series signal 170 that is sampled at the target sampling rate based on multiplying the linking coefficient and a second set of phase factors for each prominent frequency to produce new values at the new time points 165.

Further details regarding frequency-domain resampling system 100 are presented herein. In one embodiment, the operation of frequency-domain resampling system 100 will be described with reference to example frequency-domain resampling method 200 shown in FIG. 2, and example frequency-domain resampling method 400 shown in FIG. 4. In one embodiment, the operation of power spectrum generator 105 and prominent frequency selector 110 will be described in further detail with reference to example periodogram 300 shown in FIG. 3.

—Example Frequency-Domain Resampling Method—

Figure 2:
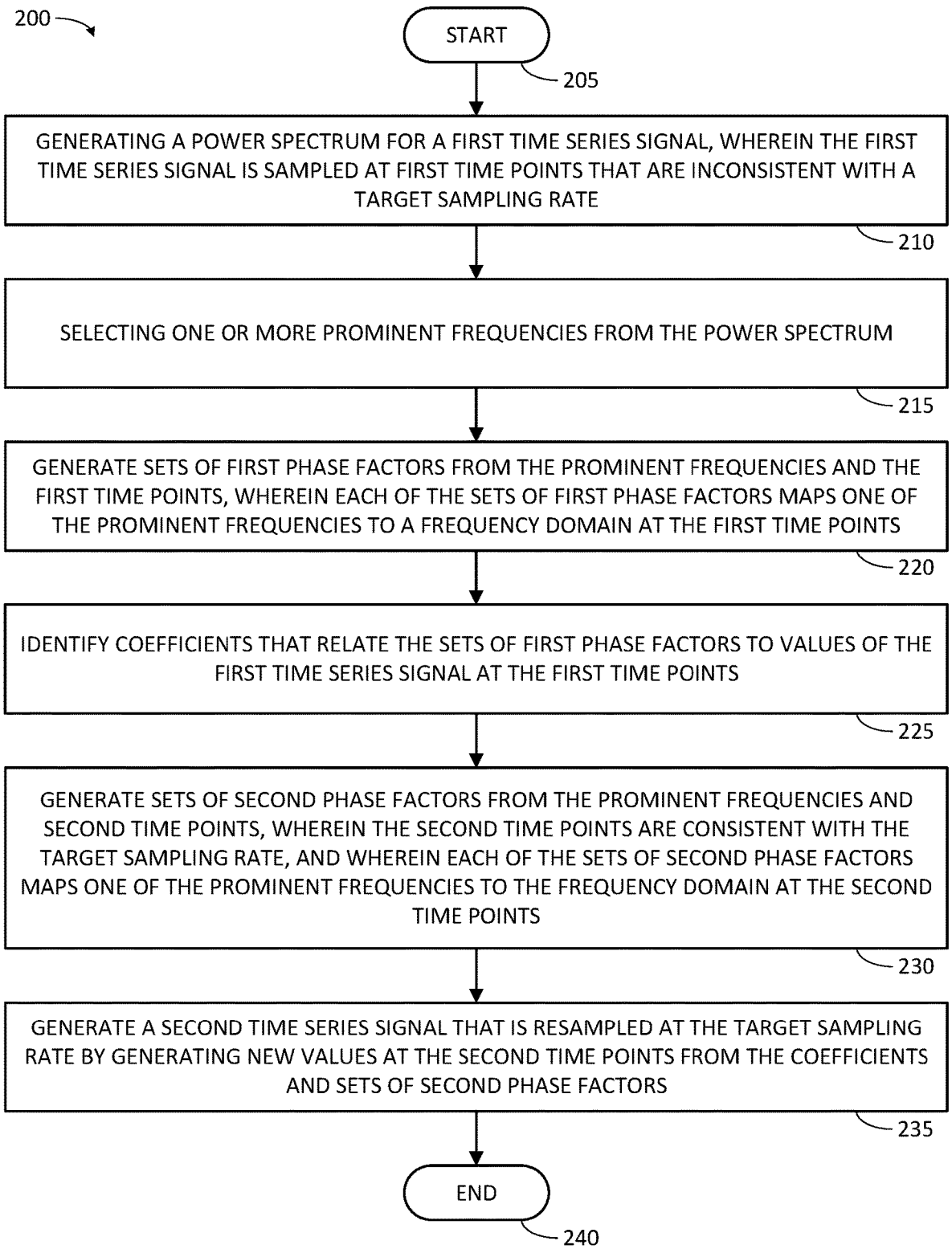
FIG. 2 illustrates one embodiment of a frequency-domain resampling method associated with analytical resampling of time series signals in the frequency domain.

FIG. 2 illustrates one embodiment of a frequency-domain resampling method 200 associated with analytical resampling of time series signals in the frequency domain. For example, the frequency-domain resampling method 200 accepts time series signals that are originally sampled at a first set of (potentially uneven) intervals, and using frequency domain transforms that automatically generate prominent frequencies that are components of the time series signal, generates a new time series signal that is sampled at a target sampling interval. Thus, in one embodiment, the frequency-domain resampling method 200 resamples a time series signal from observations at original time points to observations at new time points.

As an overview, the frequency-domain resampling method 200 generates a power spectrum for a first time series signal. The first time series signal is sampled at first time points that are inconsistent with a target sampling rate. The frequency-domain resampling method 200 then selects one or more prominent frequencies from the power spectrum. For each of the prominent frequencies, the method 200 generates a first set of phase factors that map the prominent frequency into a frequency domain at the first time points. For each of the prominent frequencies, the method 200 also identifies coefficients that relate the sets of first phase factors to values of the first time series signal at the first time points. And, for each of the prominent frequencies, the method 200 generates a second set of phase factors that map the prominent frequency into the frequency domain at second time points. The second time points are consistent with the target sampling rate. The method 200 then generates a second time series signal. The second time series signal is sampled at the target sampling rate. The method 200 generates the second time series signal based on multiplying the coefficient and the second set of phase factors for each prominent frequency to produce new values at the second time points.

In one embodiment, frequency-domain resampling method 200 initiates at start block 205 in response to a processor of a computer determining one or more of: (i) an incoming time series signal for resampling has been detected; (ii) a next time series signal in a set of time series signals to be resampled has been reached; (iii) an instruction to perform frequency-domain resampling method 200 on a time series signal has been received; (iv) a user or administrator of frequency-domain resampling system 100 has initiated frequency-domain resampling method 200; (v) it is currently a time at which frequency-domain resampling method 200 is scheduled to be run; or (vi) that frequency-domain resampling method 200 should commence in response to occurrence of some other condition. In one embodiment, the computer is configured by computer-executable instructions to execute components of frequency-domain resampling system 100 in accordance with frequency-domain resampling method 200. Following initiation at start block 205, frequency-domain resampling method 200 continues to process block 210.

—Example Method—Power Spectrum Generation—

At process block 210, frequency-domain resampling method 200 is generating a power spectrum for a first time series signal. The first time series signal is sampled at first time points that are inconsistent with a target sampling rate. Thus, in one embodiment, frequency-domain resampling method 200 computes a power spectrum of a potentially unevenly sampled signal. In one embodiment, frequency-domain resampling method 200 creates a function that describes the power spectrum of the time series signal. As discussed below, this power spectrum indicates the distribution of power among frequency components of the first time series signal. In other words, the power spectrum shows the magnitude of the contribution of each frequency component to the first time series signal.

In one embodiment, at process block 210 frequency-domain resampling method 200 receives a first time series signal as an input. The first time series signal may also be referred to herein as an input time series signal. In one embodiment, the first time series signal may be retrieved from storage. Or, in one embodiment, the first time series signal may be received in a live stream from a sensor. In one embodiment, the first time series signal may be a signal of actual observed values detected by sensors as data points.

The first time series signal includes a series of data points at discrete time points. In one embodiment, a time point is a time signature or a time stamp for a data point in a time series signal. In other words, the time point is the time at which a data point occurred. The data points of the first time series signal represents values of a measured variable (such as a sensor reading) as of the time points at which the data points occur. The first time series signal represents the change in the measured variable over time. The data points may also be referred to as samples or observations. The time points indicate a time at which the variable was measured to create a data point. Thus, each data point has a corresponding time point (or time stamp).

Sampling refers to acquiring or providing a value of a data point for a given time point, and a sample is the value. Sampling may be repeated at multiple time points (that is, points in time) to generate a time series signal such as the first time series signal. In one embodiment, a sample may be measured by observation of a sensed value at a time point. Or, in one embodiment, a sample may be generated by synthesizing a value for a time point using a resampling process such as frequency-domain resampling method 200. Thus, a time series signal may be sampled at the time points.

Where values for data points in a time series signal are acquired with a consistent interval of time between samples, the time series signal is sampled at an even sampling rate. The even sampling rate is 1 sample per interval. Where values for data points in a time series signal are acquired with varying amounts of time between samples, time series signal is sampled unevenly, or sampled with an uneven sampling rate. Where multiple time series signals share an even sampling rate in common, the sampling rate may be said to be a uniform sampling rate for the multiple time series signals.

A target sampling rate may be specified for a resampled signal produced by frequency-domain resampling method 200. The target sampling rate is a pre-selected interval between time points. The target sampling rate is a "target" in the sense that it is an objective, goal, or result sampling rate to which one or more time series are to be sampled. In one embodiment, the target sampling rate spaces the time points for data points uniformly in time.

In one embodiment, the target sampling rate is provided by user input to the system. In one embodiment, the target sampling rate is automatically selected. For example, a maximum sampling rate may be identified in a collection of time series signals, and this maximum rate is selected to be the target sampling rate. Or, for example, a sampling rate that strikes a balance (based on parameters specified by a user or administrator) between sampling rate and compute requirements may be identified, and the sampling rate selected to be the target sampling rate.

In one embodiment, the first time series signal (which is provided as an input for resampling to the target sampling rate) is sampled at time points that are inconsistent with the target sampling rate. As used herein, sampling of a time series is inconsistent with a target sampling rate when the time points of the time series do not recur at the target sampling rate. Inconsistency with the target sampling rate may be due, for example, to a time series signal having time points that recur at a sampling rate other than the target sampling rate, having irregular spacing of time points, or having time shift of time points, or some combination of these reasons.

In one embodiment, at process block 210, frequency-domain resampling method 200 generates a power spectrum from the input time series signal. The power spectrum describes the distribution of power for the input time series signal across the range of component frequencies that make up the input time series signal. For example, a curve (or function) that represents the power of the input time series signal over a range of frequencies, such as a periodogram or power spectral density (PSD) curve, may be produced. In one embodiment, the function or curve generated may be referred to simply as the power spectrum. The power spectrum, that is, the curve or function, is provided as output from process block 210 for subsequent processing.

The power spectrum may be generated by spectral analysis of the first time series signal. In general, spectral analysis operates to represent or approximate a signal by sums of simpler component sinusoids. In one embodiment, the first time series signal is decomposed into component sinusoids. In one embodiment, a curve (or function) that describes the distribution of power in the first time series signal among the component sinusoids is then generated to be the power spectrum. The power spectrum describes the time series signal in the frequency domain. In one embodiment, the spectral analysis is a Lomb-Scargle analysis (or other least-squares spectral analysis) that estimates a least-squares fit of sinusoids to the first time series signal.

In one embodiment, the power spectrum is generated upon receiving a sufficiently long segment (or range of time points) of the first time series signal to support the spectral analysis. Various segment lengths may be appropriate. For example, where an entire length of the first time series signal has been previously recorded, the segment of the first time series signal may be the full length of the time series signal. Or, for example, where the first time series signal is streaming, the segment of the first time series signal may be an amount of the first time series signal that fills a buffer. In one embodiment, the segment should cover a range of time at least as long as the longest period (or lowest frequency) that is to be included in the power spectrum. These and other segment lengths may be designated by configuration of frequency-domain resampling system 100.

A frequency of a component sinusoid may be referred to herein as a "component frequency" of a time series signal. In one embodiment, peaks occur in the power spectrum at component frequencies (or periods) of the input time series signal. For example, in the power spectrum the peaks are centered on the frequencies (or periods) that in sum represent or approximate the input time series signal. The height of a peak in the power spectrum indicates an extent of prominence in the input time series signal of a component frequency at the peak. Thus, the power spectrum may be used to identify more prominent frequencies among those component frequencies that make up the input time series signal (as discussed in further detail herein). And, the power spectrum may be used to identify less prominent frequencies that make up the input time series signal (as discussed in further detail herein).

As an illustrative example, let one of the observed time-series signals (such as the first time series signal) be [$Obs_{t_1}$, $Obs_{t_2}$, ..., $Obs_{t_M}$], which is sampled at M discrete time points that are potentially unevenly selected on the time axis. (The observations of the time series signal are real numbers). The Lomb-Scargle periodogram is the power spectrum that will be used to extract the prominent frequencies in the time series signal. The Lomb-Scargle periodogram function $P_{LS}$ (f) is:

$$P_{LS}(f) = \frac{1}{2\sigma^2}\left\{\frac{\left[\sum_{m=1}^{M}(Obs_{t_m} - \overline{Obs})\cos(2\pi f(t_m - \tau))\right]^2}{\sum_{m=1}^{M}\cos^2(2\pi f(t_m - \tau))} + \frac{\left[\sum_{m=1}^{M}(Obs_{t_m} - \overline{Obs})\sin(2\pi f(t_m - \tau))\right]^2}{\sum_{m=1}^{M}\sin^2(2\pi f(t_m - \tau))}\right\} \quad \text{Eq. 1}$$

where $\overline{Obs}$ and $\sigma^2$ are the mean and variance of [$Obs_{t_1}$, $Obs_{t_2}$, ..., $Obs_{t_M}$]. Compared to traditional power spectrum density (PSD) calculation method, the Lomb-Scargle periodogram can generate the PSD for unevenly sampled time series. The time lag $\tau$ is defined as:

$$\tan(2(2\pi f)\tau) = \frac{\sum_{m=1}^{M}\sin(2(2\pi f)t_m)}{\sum_{m=1}^{M}\cos(2(2\pi f)t_m)} \quad \text{Eq. 2}$$

Thus, in one embodiment, the function for the power spectrum is given by a Lomb-Scargle periodogram $P_{LS}(f)$ calculated for the first time series signal.

In one embodiment, the function for the power spectrum is given by the Lomb-Scargle periodogram for the first time series signal. The Lomb-Scargle periodogram allocates more energy to actual component frequencies than does a fast Fourier transform (FFT), whereas the FFT allocates more energy around the component frequencies. Thus, the Lomb-Scargle periodogram has sharp, prominent spikes centered on frequencies that possess significant information content. Also, unlike some transform operations (such as a FFT), the Lomb-Scargle periodogram may be generated for time series signals that are sampled unevenly in time.

In an alternative embodiment, the function for the power spectrum is given by a non-uniform discrete Fourier transform (NUDFT) of the first time series signal. Like the Lomb-Scargle periodogram, the spectral analysis to perform the NUDFT accommodates unevenly sampled signals. However, the NUDFT can exhibit less sharp and less prominent peaks around component frequencies that represent information content than would the Lomb-Scargle periodogram.

Thus, in one embodiment, frequency-domain resampling method 200 generates a power spectrum for a first time series signal (an input time series signal) by receiving the first time series signal, decomposing the first time series signal into component sinusoids, generating, as the power spectrum, a curve or function that describes distribution of power among frequencies corresponding the component sinusoids. Process block 210 then completes, and frequency-domain resampling method 200 continues at process block 215. In one embodiment, the functions of process block 210 are performed by power spectrum generator 105. At the completion of process block 210, frequency-domain resampling method 200 has generated or created a power spectrum that represents the first time series signal in the frequency domain. This power spectrum may be used to distinguish between frequencies that carry more information content of the first time series signal and frequencies that carry more noise content of the first time series signal.

Figure 3:
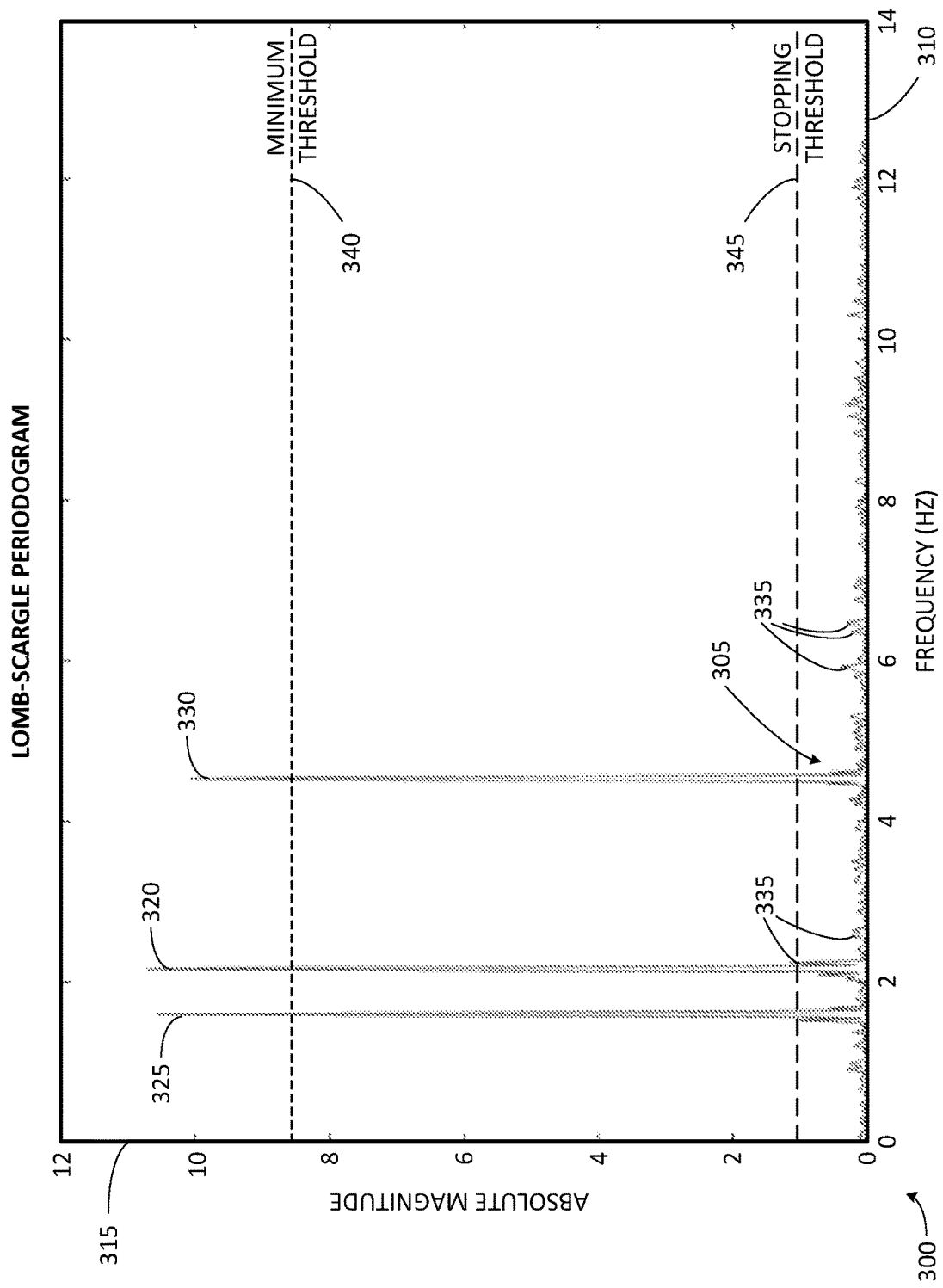
FIG. 3 illustrates a plot of an example power spectrum.

Referring now to FIG. 3, FIG. 3 illustrates a plot 300 of an example power spectrum 305. Example power spectrum 305 is a Lomb-Scargle periodogram. Example power spectrum 305 is plotted in two dimensions against a frequency axis 310 and an absolute magnitude axis 315. Example power spectrum 305 shows the absolute magnitude of power in an example time series signal allocated over a range or spectrum of frequencies. Example power spectrum 305 exhibits three prominent spectral peaks, including a highest peak 320 at 2.17 Hz, a second highest peak 325 at 1.61 Hz, and a third highest peak 330 at 4.55 Hz. Highest peak 320 has a height (or magnitude) of approximately 10.8, second highest peak 325 has a height of approximately 10.6, and third highest peak 330 has a height of approximately 10.2. Example power spectrum 305 also exhibits various other, shorter peaks (such as shorter peaks 335) at a variety of frequencies. The shorter peaks are non-meaningful, and result from noise on the example time series signal. The noise on the example time series signal is Gaussian noise with a standard deviation of 0.25.

—Example Method—Prominent Frequency Selection—

Referring again to FIG. 2, at process block 215, frequency-domain resampling method 200 is selecting one or more prominent frequencies from the power spectrum. For example, the frequency-domain resampling method 200 chooses some component frequencies of the time series signal that clearly have information content, while excluding other component frequencies that carry less or no information. In one embodiment, frequency-domain resampling method 200 selects those component frequencies that have peaks in the power spectrum that are higher than a specified threshold as the prominent frequencies. In one embodiment, the threshold is made to be adaptive by setting the threshold to be a fixed portion of the highest peak in the power spectrum.

As discussed above, the power spectrum shows the distribution of power in the input time series signal over component frequencies of the input time series signal. Prominent frequencies are selected from among the component frequencies in the power spectrum. In one embodiment, the action of selecting a frequency (or period) from the power spectrum is performed by identifying the frequency from among the component frequencies as being prominent, and then including the identified frequency in a set of prominent frequencies. The set of prominent frequencies may be a data structure such as an array of one or more frequencies. A frequency may be recorded in the set of prominent frequencies as a number of occurrences of an event per unit of time. The set of prominent frequencies is provided for creation of sets of phase factors (also referred to as discrete Fourier transform atoms) for each of the prominent frequencies.

The frequencies that are selected are "prominent" frequencies. As used herein, the term "prominent" applied to a frequency indicates that there is substantial power in the input time series signal at that frequency. In other words, a prominent frequency is a component frequency of the input time series signal at which there is strong repeating content in the input time series signal. Component frequencies with strong repeating content in the input time series signal carry more information than component frequencies with weaker repeating content. In one embodiment, the prominent frequencies are those component frequencies of the input time series signal that are determined to be prominent based on magnitude at the frequency in the power spectrum for the input time series signal.

A peak or local maximum appears in the power spectrum at a prominent frequency. A prominent frequency may therefore be detected by identifying peaks in the power spectrum. A determination of whether a frequency is a prominent frequency or not may be determined by comparing the height of a peak corresponding to the frequency with a minimum threshold. The minimum threshold differentiates the frequencies that carry information from the frequencies that carry noise. Where the height of a peak (also referred to herein as peak height) for a frequency satisfies the minimum threshold, the frequency will be considered to be prominent. Where peak height for a frequency does not satisfy the minimum threshold, the frequency will not be considered to be prominent. Peak height may also be referred to as "magnitude" of the peak. Where the power spectrum is a Lomb-Scargle periodogram of the first time series signal, the peaks around the component frequencies of the first time series signal that carry information content of the first time series signal are well-defined, sharp, and tall in relation to peaks around frequencies that represent noise or weaker repeating content in the first time series signal.

In one embodiment, the minimum threshold may be set or pre-configured by a user or administrator of frequency-domain resampling system 100. In one embodiment, the minimum threshold is an adaptive minimum that is measured relative to a height of a highest spectral peak in the power spectrum. In one embodiment, the minimum threshold is a fixed portion or ratio of a highest spectral peak in the power spectrum. In other words, the minimum threshold may be satisfied by a spectral peak that exceeds the fixed ratio of the magnitude of the spectral peak with the greatest magnitude in the power spectrum. In other words, the minimum threshold may be a fixed ratio of the greatest magnitude of a peak. In one embodiment, the user or administrator may set the minimum threshold by providing a ratio value (such as a percentage) for the fixed ratio. In one embodiment, the minimum threshold may be set at 80 percent of the height of the highest spectral peak. In one embodiment, the threshold may be set at other percentages of the height of the highest spectral peak.

For example, referring again briefly to FIG. 3, the height of highest peak 320 is 10.8. An example minimum threshold 340 is set at 80 percent of the height of highest peak 320, at a height of 8.64. The example minimum threshold 340 distinguishes highest peak 320, second highest peak 325, and third highest peak 330 as prominent peaks in relation to shorter peaks (such as shorter peaks 335). The three component frequencies at which the prominent peaks are centered, 2.17 Hz, 1.6 Hz, and 4.55 Hz in descending order of peak height, are therefore identified as the prominent frequencies in the example power spectrum 305. (K=3, where K is the number of prominent frequencies, as discussed below.) The frequencies of the shorter peaks (such as shorter peaks 335) that fall below example minimum threshold 340 are evicted as noise elements, and thus disregarded because they do not carry information about the monitored system. This is appropriate because these shorter peaks are due to noise on the example time series signal from which example power spectrum 305 was generated.

In one embodiment, the minimum threshold defines a noise floor that indicates that any spectral peaks below it are noise or otherwise insufficiently information-bearing. Component frequencies with peaks that fall below the minimum threshold are not selected as prominent. These noisy and/or less prominent component frequencies of the power spectrum are thus evicted or excluded by the threshold from being used to generate resampled signals from the frequency domain. In this manner, the noisy component frequencies are removed from the input time series signal, thus denoising the input time series signal. Evicting the noisy and/or less prominent component frequencies is beneficial for the purposes of frequency-domain resampling. Evicting all frequencies but the prominent frequencies allows the frequency domain resampling method to resample from a signal that has had the vast majority of noise and less-informative content removed from it. The output time series signal resulting from the frequency domain resampling method will therefore be denoised with respect to the input time series signal.

In one embodiment, a "stopping threshold" of spectral peak magnitude (height) is also provided. All peaks in the power spectrum that fall below the stopping threshold are evicted, regardless of whether they exceed the minimum threshold. The stopping threshold ensures that noise elements are evicted. In one embodiment, the stopping threshold is a non-relative magnitude value. The stopping threshold does not change based on peak heights in the power spectrum. The stopping threshold is thus set at a fixed height. In one embodiment, the stopping threshold is set at a value expected to be higher than most noise values. The stopping threshold may be set or pre-configured by a user or administrator of frequency-domain resampling system 100. In one embodiment, the height for the stopping threshold is automatically pre-determined based on expected noise levels for the type of sensor from which the input time series signal is received.

For example, referring again briefly to FIG. 3, an example stopping threshold 345 is shown. The example stopping threshold is set at a height of 1. Other heights for the stopping threshold may also be appropriate. The frequencies of the shorter peaks (such as shorter peaks 335) that fall below example stopping threshold 345 are evicted as noise elements, and thus disregarded because they do not carry information about the monitored system.

Although not shown, another example illustrates the operation of example stopping threshold. Were the highest peak to have a value of 1.1, and the second highest peak to have a value 0.95, the second highest peak would be evicted because it was below example stopping threshold 345, even though the second highest peak would exceed the adaptive minimum threshold of 0.88, or 80% of the highest peak value of 1.1.

In one embodiment, to select the prominent frequencies, the peaks in the power spectrum are identified, ranked in order of height, and compared to the minimum threshold and stopping threshold; and then the frequencies corresponding to the peaks that satisfy the thresholds are selected as prominent frequencies. An algorithm for finding peaks or local maxima in two dimensions may be used to identify the peaks or local maxima of the power spectrum. For example, the magnitude of the power spectrum function may be determined at each of an incremental series of frequencies. The magnitude at each individual frequency may be compared to the magnitude at the immediately adjacent frequencies (that is, the frequency immediately preceding the frequency under consideration and the frequency immediately following the frequency under consideration). Where the magnitude at the frequency exceeds the magnitude at both immediately adjacent frequencies, the frequency is a maximum. Values for the frequency and the magnitude are stored in a set of peaks in the power spectrum for further processing. The set of peaks may be stored as a data structure such as an array of pairs of frequency values and magnitude values.

The set of peaks in the power spectrum is sorted in order of magnitude. Any suitable sorting algorithm may be employed to perform this sort. Once sorted, the highest peak, that is, the peak with the greatest magnitude, is used to set the minimum threshold of peak height for distinguishing what is, and what is not, a prominent frequency. The peak height (magnitude) of the highest peak (or greatest local maximum) is multiplied by the fixed portion (such as 80 percent) to generate the minimum threshold. The minimum threshold is thus a threshold of magnitude.

In one embodiment, the sorted set of peaks is examined to determine which peaks fall above the minimum threshold and the stopping threshold (and therefore satisfy the thresholds), and which do not. In one embodiment, the peaks in the sorted set of peaks are compared to the minimum and stopping thresholds in descending order of successive peak heights until a peak that falls below either threshold is reached. For each peak that does not fall below the minimum threshold and the stopping threshold, the corresponding frequency for that peak is added to the set of prominent frequencies. Thus, in one embodiment, one or more prominent frequencies are selected from the power spectrum. Process block 215 thus operates to produce a set of prominent frequencies.

In one embodiment, frequency domain resampling method selects one or more prominent frequencies from a Lomb-Scargle periodogram of the input time series signal. A minimum threshold is set, and a stopping threshold is set. The frequencies that have higher magnitudes in the Lomb-Scargle periodogram $P_{LS}(f)$ than both the minimum threshold and the stopping threshold are selected as the prominent frequencies. A quantity of K prominent frequencies are selected, where K is the number of frequencies with peaks in the Lomb-Scargle periodogram $P_{LS}(f)$ that are greater in magnitude than both the minimum threshold and the stopping threshold. The K prominent frequencies are denoted by $f_1, \ldots, f_K$.

Thus, in one embodiment, frequency domain resampling method 200 selects one or more prominent frequencies from the power spectrum by identifying peaks in the power spectrum by frequency and magnitude, sorting the peaks in order of magnitude, identifying a highest peak having a greatest magnitude, calculating a minimum threshold based on a pre-configured fixed portion of the greatest magnitude and obtaining a stopping threshold, comparing the magnitudes of the peaks to the minimum threshold and stopping threshold, and adding a frequency of a peak to a set of prominent frequencies where a magnitude of the peak exceeds (and therefore satisfies) the minimum threshold and the stopping threshold. Note that where the minimum threshold exceeds the stopping threshold, comparison with the stopping threshold is redundant and may be bypassed or not performed. Process block 215 then completes, and frequency-domain resampling method 200 continues at process block 220. In one embodiment, the functions of process block 215 are performed by prominent frequency selector 110.

In one embodiment, in the selection of prominent frequencies from the Lomb-Scargle periodogram, peaks in the periodogram that are "below the noise floor" are evicted in the frequency domain. In other words, peaks that are below the minimum threshold separating informative component frequencies and noise component frequencies are discarded, and not included as prominent frequencies. Also, peaks that are below the stopping threshold separating potentially informative component frequencies from definite noise are also discarded, and not included in the prominent frequencies.

The component frequencies of the input time series signal that are thus evicted as noise components of the input time series signal will not be used in subsequent steps of frequency-domain resampling method 200 to generate an output time series signal. Removal of noise-bearing frequencies provides the advantage that the output time series signals produced by the subsequent steps of frequency-domain resampling method 200 actually represent the sensor measurements more accurately than the original measurements received from the sensors. The use of frequency-domain-resampled time series signals results in higher prognostic accuracy and earlier anomaly detection for detecting incipient faults in noisy process signals. The increased accuracy and earlier detection have been demonstrated experimentally, as discussed herein.

—Example Method—Input Phase Factor Dictionary Generation—

At process block 220, frequency-domain resampling method 200 is generating sets of first phase factors from the prominent frequencies and the first time points. Each of the sets of first phase factors maps one of the prominent frequencies to a frequency domain at the first time points. For example, frequency-domain resampling method 200 may build a dictionary of sets of phase factors that map prominent frequencies to the frequency domain at those time points where observations exist in the input time series signal. The sets of first phase factors will be used in subsequent processing to calculate complex coefficients that indicate the contributions of the prominent frequencies to the input signal, as discussed below at process block 225.

Because the sets of first phase factors are used for mapping at the first time points, that is for mapping at the original time points of the input time series signal, the sets of first phase factors may also be referred to herein as sets of input phase factors.

In one embodiment, a phase factor is a complex exponential number that may be expressed in the form $e^{(j2\pi f_k t_m)}$, where j is the imaginary unit $\sqrt{-1}$, $f_k$ is one of the prominent frequencies, and $t_m$ is one of the time points of the input time series signal (the first time points). The phase factor is a unit complex number: a complex number that has an absolute value of 1.

In one embodiment, a phase factor maps a prominent frequency to the frequency domain at an individual time point of a time series signal. As used herein, a map or mapping to the frequency domain refers to a function, operator, or transform that translates from expression in terms of time (time-domain) to expression in terms of frequency (frequency-domain). The phase factor expression $e^{(j2\pi f_k t_m)}$ provides a mapping to the frequency domain. The phase factor expression $e^{(j2\pi f_k t_m)}$ indicates what a position along a circular (or oscillating) motion with prominent frequency $f_k$ will be at time $t_m$. The position along the circular (or oscillating) motion describes prominent frequency $f_k$ at time point $t_m$ in terms of frequency, thereby mapping the prominent frequency to the frequency domain at an individual time point. Thus, a phase factor for a time point indicates the current phase of a prominent frequency as of the time point.

In one embodiment, each set of input phase factors includes a phase factor for each time point in the input time series signal. The set of input phase factors are ordered in the order of the time points of the input time series signal (the first time points). In one embodiment, the phase factors in the set of input phase factors for a frequency $f_k$ is the series $e^{(j2\pi f_k t_1)}, \ldots, e^{(j2\pi f_k t_M)}$, where $t_1, \ldots, t_M$ are the time points of the input time series signal. Thus, each set of phase factors is as long as the number of time points (or samples) M in the input signal. A set of phase factors (such as a set of input phase factors) may also be referred to herein as a discrete Fourier transform (DFT) atom. In one embodiment, a set of input phase factors is generated for each of the prominent frequencies. A collection of sets of phase factors where there is a set of phase factors for each prominent frequency may also be referred to herein as a dictionary of sets of phase factors (or a dictionary of DFT atoms). A set of phase factors for a prominent frequency indicates a current phase of the prominent frequency at the original time points of the input time series signal.

In one embodiment, sets of input phase factors are generated from the prominent frequencies selected at process block 215 and the time points of the input time series signal (the first time points). In one embodiment, to generate a set of phase factors for a prominent frequency, the prominent frequency is inserted for $f_k$ in the phase factor expression $e^{(j2\pi f_k t_m)}$, and each of the time points of the input time series signal (the first time points) is inserted for $t_m$ in the phase factor expression in turn. For each of the time points of the input time series signal, the value of the phase factor is calculated, and placed into a data structure for the set of input phase factors for the prominent frequency. The data structure may be, for example, an array of length M.

A set of input phase factors (or DFT atom) corresponds to a prominent frequency in a one-to-one relationship. Therefore, generation of the set of input phase factors as described above is repeated for each of the K prominent frequencies. In this way, a set of input phase factors (or DFT atom) is generated for each of the prominent frequencies, producing a collection of sets of input phase factors (or DFT atoms), which may be referred to herein as an input dictionary. The input dictionary may be, for example, a data structure such as a matrix of dimensions K×M. The data structure may store arrays of input phase factors for each of the prominent frequencies.

At the completion of process block 220, a dictionary is built that contains sets of input phase factors (or DFT atoms) at the selected prominent frequencies $f_1, \ldots, f_K$ and time points $t_1, \ldots, t_M$. The K sets of input phase factors are:

$$\begin{bmatrix} e^{(j2\pi f_1 t_1)} \\ e^{(j2\pi f_1 t_2)} \\ \vdots \\ e^{(j2\pi f_1 t_M)} \end{bmatrix}, \ldots, \begin{bmatrix} e^{(j2\pi f_K t_1)} \\ e^{(j2\pi f_K t_2)} \\ \vdots \\ e^{(j2\pi f_K t_M)} \end{bmatrix} \quad \text{Eq. 3}$$

Thus, in one embodiment, frequency domain resampling method 200 generates sets of input phase factors (i.e., sets of first phase factors) from the prominent frequencies and the original time points (i.e., first time points) by, for each combination of one of the prominent frequencies and one of the original time points, retrieving the value of the prominent frequency and input time point; inserting the prominent frequency and input time point into the expression for the phase factor; calculating a value for the input phase factor by executing the phase factor expression using the values of the prominent frequency and input time point; and storing the resulting value of the input phase factor in position for the time point in a set of phase factors that corresponds to the prominent frequency. The resulting sets of input phase factors for the prominent frequencies are an input dictionary of sets of phase factors. Process block 220 then completes, and frequency-domain resampling method 200 continues at process block 225. In one embodiment, the functions of process block 220 are performed by input dictionary generator 115. The input dictionary provides a mapping at the time points of the input time series signal—which is not sampled at the target sampling rate—in order to enable the identification of complex coefficients that describe the contribution of each prominent frequency to the input time series signal.

—Example Method—Linking Coefficient Identification—

At process block 225, frequency-domain resampling method 200 is identifying coefficients that relate the sets of first phase factors to values of the first time series signal at the first time points. In one embodiment, frequency-domain resampling method 200 finds how much each prominent frequency contributes to the input time series signal, and how much each prominent frequency is shifted in phase. This magnitude and phase information for each prominent frequency is encoded in the complex coefficient for the prominent frequency. For example, frequency-domain resampling method 200 calculates a coefficient for each prominent frequency such that the sum of the products of the coefficient and a phase factor for a time point in the set of phase factors for each prominent frequency approximates the data value of the input time series signal at the time point.

Because the coefficients provide a link between—that is, describe the relationship between—sets of phase factors and the data values at the time points of the input time series signal, the coefficients may be referred to herein as linking coefficients.

The linking coefficients are complex constants. Thus, in one embodiment, the linking coefficients are complex coefficients. Each linking coefficient corresponds to one of the prominent frequencies in a one-to-one relationship. Recall that the prominent frequencies are component frequencies of the input time series signal. The linking coefficient describes both the magnitude and phase of a prominent frequency. The linking coefficient thus describes the manner in which the corresponding prominent frequency contributes to the input time series signal. In other words, the magnitude information encoded in the linking coefficient describes how strong a component of the input time series signal each prominent frequency is. And, the phase information encoded in the linking coefficient describes how much a cycle of the prominent frequency is shifted (or displaced or offset) in time as a component of the input time series signal.

The values of the input time series signal at the original time points are the observations or data points of the input time series signal. The observations or data points of the input time series signal $[Obs_{t_1}, Obs_{t_2}, \ldots, Obs_{t_M}]$ can be described by a linear combination of the product of the set of input phase factors and a complex coefficient (a linking coefficient) for each of the prominent frequencies, thus:

$$\begin{bmatrix} Obs_{t_1} \\ Obs_{t_2} \\ \vdots \\ Obs_{t_M} \end{bmatrix} = c_{f_1} \begin{bmatrix} e^{(j2\pi f_1 t_1)} \\ e^{(j2\pi f_1 t_2)} \\ \vdots \\ e^{(j2\pi f_1 t_M)} \end{bmatrix} + \ldots + c_{f_k} \begin{bmatrix} e^{(j2\pi f_k t_1)} \\ e^{(j2\pi f_k t_2)} \\ \vdots \\ e^{(j2\pi f_k t_M)} \end{bmatrix} \quad \text{Eq. 4}$$

where $c_{f_1}, \ldots, C_{f_K}$ are the linking coefficients.

The linking coefficients therefore provide a link between an observation or data value at the time point in the input time series signal and a phase factor for the time point in the set of input phase factors for each prominent frequency. The linking coefficient relates a set of phase factors with the data values of a time series signal. In other words, the linking coefficients describe the relationship between the sets of input phase factors and the values of the input time series signal at the original time points. The linking coefficient explains the relationship or link between a phase factor for a time point in a set of phase factors and the data value at the time point in a time series. For example, the linking coefficients relate or link the phase factors at a time point for each prominent frequency to a data value of the input time series signal at that time point by providing the magnitude and phase information for the contributions of each prominent frequency as of the time point. As shown in Eq. 4 above, a data value at a time point in the input time series signal is given or approximated by the sum of the multiples, for each prominent frequency, of a phase factor for the time point and prominent frequency and a linking coefficient for the prominent frequency.

In one embodiment, identifying the coefficients refers to determining the values of the linking coefficients. For example, the values of the linking coefficients may be determined by least-squares regression. Eq. 4 can be rewritten as:

$$\begin{bmatrix} Obs_{t_1} \\ Obs_{t_2} \\ \vdots \\ Obs_{t_M} \end{bmatrix} = \begin{bmatrix} e^{(j2\pi f_1 t_1)} & \ldots & e^{(j2\pi f_k t_1)} \\ e^{(j2\pi f_1 t_2)} & \ldots & e^{(j2\pi f_k t_2)} \\ \vdots & \ldots & \vdots \\ e^{(j2\pi f_1 t_M)} & \ldots & e^{(j2\pi f_k t_M)} \end{bmatrix} \begin{bmatrix} c_{f_1} \\ \vdots \\ c_{f_k} \end{bmatrix} \quad \text{Eq. 5}$$

so the $c_{f_1}, \ldots, c_{f_K}$ can be solved by least squares regression (for complex numbers).

A time series signal can be generated or "recovered" from the linking coefficients and phase factors by executing the right side of Eq. 5 above to produce a recovered time series signal of recovered data values. As used herein, the term "recovered" refers to time series signals and data points generated from the combination of linking coefficients and sets of phase factors, for example as shown on the right side of Eqs. 4 and 5.

In one embodiment, the linking coefficients may be identified by least-squares regression. The values of the phase factors in each set are retrieved from the dictionary generated at process block 220. The observations or data points of the input time series are retrieved from the time series signal. To identify the linking coefficients, least-squares regression is performed on the phase factors and observations. The least-squares regression operation adjusts values of the linking coefficients until the sum of the squares of differences between actual values for the observations and recovered values for the observations that are produced from the linking coefficients and phase factors is minimized. In other words, the least squares operation adjusts the linking coefficients until the recovered time series signal is a best fit to the input time series signal. The "best fit" is determined in the sense that the sum of the squared differences between original values and recovered values is minimized. The adjustments to each linking coefficient may be made by increasing and/or decreasing a current value for the linking coefficient until further adjustment would cause the sum of the squared differences between original values and recovered values to increase away from a minimum. The values for the linking coefficients have been determined once the sum of the squares of differences reaches a minimum, thereby identifying the linking coefficients.

The identified linking coefficients $c_{f_1}, \ldots, c_{f_K}$ may be stored in a data structure with reference to a corresponding set of phase factors (atom) and/or corresponding prominent frequency. For example, the identified linking coefficients may be stored in an array of linking coefficients.

The identified linking coefficients $c_{f_1}, \ldots, c_{f_K}$ contain both the magnitude and phase information for the K prominent frequencies. As mentioned above, the linking coefficients are complex coefficients, and a coefficient $c_{f_K}$ for a prominent frequency $f_k$ is expressible in the form of the sum of a real component a and an imaginary component bj ($c_{f_k}$=a+bj). The magnitude information for a prominent frequency $f_k$ may be extracted from the complex linking coefficient $c_{f_k}$ for the prominent frequency as the square root of the sum of the squares of the real component a and the absolute value of the imaginary component b (magnitude=$\sqrt{(a^2+b^2)}$). The phase information for a prominent frequency $f_k$ may be extracted from the complex linking coefficient $c_{f_k}$ for the prominent frequency as the arctangent of the quotient of the absolute value of the imaginary component b and the real component a (phase=arctan(b/a)).

Thus, in one embodiment, frequency-domain resampling method 200 identifies linking coefficients that relate the sets of first phase factors to values of the first time series signal at the first time points by repeatedly adjusting values of complex linking coefficients corresponding to the prominent frequencies, calculating a recovered time series signal from the adjusted values of the complex linking coefficients and the sets of first phase factors, comparing the recovered time series signal to the input time series signal to find the differences between the series, summing the squares of the differences, comparing the sum against prior minimum sum to determine whether the sum is a new minimum until further adjustment no longer reduces the minimum, and storing the values for the complex linking coefficients that produced the minimum. Process block 225 then completes, and frequency-domain resampling method 200 continues at process block 230. In one embodiment, the functions of process block 225 are performed by linking coefficient identifier 120. In one embodiment, at the completion of process block 225, complex coefficients have been found that describe the magnitude and phase of each prominent frequency's contribution to the input time series signal. Together, the linking coefficients and the input dictionary of sets of phase factors represent the input time series signal in the frequency domain. The linking coefficients may be used together with sets of output phase factors for new time points to produce a resampled time series signal.

—Example Method—Output Phase Factor Dictionary Generation—

At process block 230, frequency-domain resampling method 200 is generating sets of second phase factors from the prominent frequencies and second time points. The second time points are consistent with the target sampling rate. Each of the sets of second phase factors maps one of the prominent frequencies to the frequency domain at the second time points. For example, frequency-domain resampling method 200 may build a new dictionary of sets of phase factors that map prominent frequencies to the frequency domain at those time points recurring at the target sampling rate where new data points are designated to be placed in a second time series signal. Thus, frequency-domain resampling method 200 builds new sets of phase factors for the prominent frequencies, in which the phase factors are for a new set of time steps determined by the target sampling rate. The sets of second phase factors will be used in subsequent processing in combination with the linking coefficients identified at process block 225 to produce resampled values at the new time points, as discussed below at process block 235.

The second phase factors are also referred to herein as output phase factors because the second phase factors are used to generate a resampled time series signal that is produced as output of frequency-domain resampling method 200. The second time points may also be referred to herein as new time points because they are time points at which resampled values will be created.

In one embodiment, a target sampling rate is accepted as an input to the frequency-domain resampling system. For example, the target sampling rate may be user-selected or automatically selected (as discussed above with reference to process block 210). The target sampling rate is a designated pace of samples for a resampled signal (or an interval between time points, as discussed above). In one embodiment, the target sampling rate may be provided as a value for a frequency of sampling or period between samples.

The target sampling rate may be converted to a sequence of new time points. The new time points are spaced evenly in time at an interval (or period). The interval is such that the new time points recur at the target sampling rate. The target sampling rate is thus an even sampling rate. A time series sampled at the target sampling rate will be sampled evenly, with consistent intervals of time between samples. The new time points may be specific times spaced apart by the intervals. For example, the time points such as seconds from the beginning of a time series signal, or a date and time stamp for the intervals.

In one embodiment, the frequency-domain resampling method 200 converts the target sampling rate into a sequence of new time points. A point in time is selected to be an initial time point of the new time points. In one embodiment, the initial time point is a time designating the beginning of a time range covered by the input signal. The initial time point is stored at the beginning of a sequence of new time points, for example in an array of time points. Additional time points are created. Each additional time point is evenly spaced apart by a consistent interval of time from a previous time point. The interval may be the inverse of the target sampling rate. The additional time points are stored in the array of new time points, in order of time. The additional time points are created until further additional time points would be beyond the ending of the time range covered by the input signal. In this manner, a set or sequence of new time points is created. While the first time points (discussed above at process block 220) may be inconsistent with the target sampling rate and might not recur at the intervals of the target sampling rate, the new time points (or second time points) are consistent with the target sampling rate, and do recur at the intervals of the target sampling rate.

As discussed above with reference to process block 220, a phase factor is a complex exponential unit that indicates position of circular or oscillating motion at a given time and frequency. Thus, the output phase factors map a prominent frequency to the frequency domain at the new time points by providing position of circular or oscillating motion at the new time points for each prominent frequency (as discussed above for the first time points).

The output (second) phase factors may be expressed in the form $e^{(j2\pi f_k t'_n)}$, where $t'_n$ is one of the new time points (or second time points). In one embodiment, the output phase factors in a set of output phase factors for a prominent frequency $f_k$ is the series $e^{(j2\pi f_k t'_1)}, \ldots, e^{(j2\pi f_k t'_N)}$, where $t'_1, \ldots, t'_N$ are the new time points of an output time series signal. Thus, each set of phase factors is as long as the number of new time points (or samples) N in the output time series signal. In one embodiment, a set of output phase factors is generated for each of the prominent frequencies.

In one embodiment, sets of output phase factors are generated from the prominent frequencies selected at process block 215 and the new time points of the output time series signal (the second time points). In one embodiment, to generate a set of output phase factors for a prominent frequency, the prominent frequency is inserted for $f_k$ in the phase factor expression $e^{(j2\pi f_k t'_n)}$, and each of the new time points is inserted for $t'_n$ in the phase factor expression in turn. For each of the time points of the output time series signal, the value of the phase factor is calculated, and placed into a data structure for the set of output phase factors for the prominent frequency. The data structure may be, for example, an array of length N.

Thus, in one embodiment, sets of second phase factors are generated as arrays that include a phase factor for each of the new time points. Generation of a set of output phase factors is repeated for each of the K prominent frequencies. The sets of output phase factors make up a collection of sets of output phase factors, which may be referred to herein as an output dictionary. The output dictionary may be, for example, a data structure such as a matrix of dimensions K×N. The data structure may store arrays of output phase factors for each of the prominent frequencies.

At the completion of process block 230 an output dictionary is built that contains sets of output phase factors at the selected prominent frequencies $f_1, \ldots, f_K$ and new time points $t'_1, \ldots, t'_N$. In the output dictionary the time steps $t'_1, \ldots, t'_N$ are evenly sampled at a target sampling frequency. The K sets of output phase factors are:

$$\begin{bmatrix} e^{(j2\pi f_1 t'_1)} \\ e^{(j2\pi f_1 t'_2)} \\ \vdots \\ e^{(j2\pi f_1 t'_N)} \end{bmatrix}, \ldots, \begin{bmatrix} e^{(j2\pi f_k t'_1)} \\ e^{(j2\pi f_k t'_2)} \\ \vdots \\ e^{(j2\pi f_k t'_N)} \end{bmatrix} \quad \text{Eq. 6}$$

In one embodiment, frequency-domain resampling method 200 generates sets of output phase factors (i.e., sets of second phase factors) from the prominent frequencies and new time points (i.e., second time points) by, for example, accepting or receiving a target sampling rate, creating a set of new time points based on the target sampling rate and a range of time covered by the input signal, generating a set of output phase factors for each prominent frequency from the new time points, and storing each set of new output phase factors in a data structure such as an output dictionary of sets of output phase factors. Process block 230 then completes, and frequency-domain resampling method 200 continues at process block 235. In one embodiment, the functions of process block 230 are performed by output dictionary generator 125. Together, the linking coefficients and the output dictionary of sets of phase factors describe a resampled time series signal in the frequency domain.

—Example Method—Output Time Series Signal Generation—

At process block 235, frequency-domain resampling method 200 is generating a second time series signal that is resampled at the target sampling rate by generating new values at the second time points from the coefficients and sets of second phase factors. Generating the new values at the second time points produces the second time series signal. In one embodiment, frequency-domain resampling method 200 creates a new time series signal from the coefficients and phase factors. For example, the frequency-domain resampling method 200 linearly combines the products of the set of output phase factors for each prominent frequency and the corresponding linking coefficient for each prominent frequency to generate a second, frequency-domain resampled, time series signal. The second time series signal may also be referred to herein as the output time series signal because the second time series signal is produced as the output of the frequency-domain resampling method 200.

In one embodiment, frequency-domain resampling method 200 generates a second time series signal based on the output dictionary and the linking coefficients. In one embodiment, frequency-domain resampling method 200 accepts or retrieves the linking coefficients identified at process block 225 and the output dictionary (of sets of output phase factors) generated at process block 230.

In one embodiment, frequency-domain resampling method 200 synthesizes or creates an output time series signal from frequency domain representation of prominent component frequencies of a sensor signal and time points of a target sampling rate. As discussed above with reference to process block 225, a time series signal can be generated or "recovered" based on linking coefficients and phase factors.

Thus, in one embodiment, generation of the output time series signal is based on multiplying the coefficient and the second set of phase factors for each prominent frequency. For example, frequency-domain resampling method 200 may generate an output time series signal by linear combination of the products of the set of output phase factors for each prominent frequency and the corresponding linking coefficient for each prominent frequency.

Thus, after the linking coefficients $c_{f_1}, \ldots, c_{f_K}$ are identified at process block 225 and the output dictionary generated at process block 230, the output (or recovered) time series signal $[Rec_{t_1'}, \ldots, Rec_{t_N'}]$ may be calculated as follows:

$$\begin{bmatrix} Rec_{t'_1} \\ Rec_{t'_2} \\ \vdots \\ Rec_{t'_N} \end{bmatrix} = \text{Real}\left\{ \begin{bmatrix} e^{(j2\pi f_1 t'_1)} & \cdots & e^{(j2\pi f_k t'_1)} \\ e^{(j2\pi f_1 t'_2)} & \cdots & e^{(j2\pi f_k t'_2)} \\ \vdots & \cdots & \vdots \\ e^{(j2\pi f_1 t'_N)} & \cdots & e^{(j2\pi f_k t'_N)} \end{bmatrix} \begin{bmatrix} c_{f_1} \\ \vdots \\ c_{f_k} \end{bmatrix} \right\} \quad \text{Eq. 7}$$

Executing Eq. 7 for the linking coefficients and the output dictionary produces the output time series signal $[Rec_{t'_1}, \ldots, Rec_{t'_N}]$. Performing the linear combination described by Eq. 7 produces new data points $Rec_{t'_1}, \ldots, Rec_{t'_N}$ for each of the new time points $t'_1, \ldots, t'_N$. Each new data point at a corresponding time point approximates what a data value of the input time series signal would have been if the input time series signal had been sampled at the corresponding time point. Thus, in one embodiment, frequency-domain resampling method 200 produces new data values at the new (second) time points. (The output time series signal $[Rec_{t'_1}, \ldots, Rec_{t'_N}]$ may also be referred to as an interpolated time series signal because the data values placed into the output time series signal include interpolated data values-data values that are estimates of intermediate values between known data values of the input time series signal.)

As discussed above at process block 230, the new time points $t'_1, \ldots, t'_N$ at which the output time series signal $[Rec_{t'_1}, \ldots, Rec_{t'_N}]$ is sampled recur at a target sampling rate. Because new time points $t'_1, \ldots, t'_N$ are evenly spaced at the interval indicated by the target sampling rate, output time series signal $[Rec_{t'_1}, \ldots, Rec_{t'_N}]$ is sampled at the target sampling rate.

In one embodiment, frequency-domain resampling method 200 stores or records the output time series signal $[Rec_{t'_1}, \ldots, Rec_{t'_N}]$. For example, the output time series signal may be stored as a time series signal data structure, in which the new data points $Rec_{t'_1}, \ldots, Rec_{t'_N}$ are indexed in order of new time points $t'_1, \ldots, t'_N$.

In one embodiment, the procedure of frequency-domain resampling method 200 may be repeated for additional input time series signals, for example as shown and described with reference to FIG. 4 below. These multiple input time series signals may cover a range of time in common. Where the same set of new time points $t'_1, \ldots, t'_N$ is used for generating output time series from all the multiple input time series, all the output signals will share a uniform sampling rate.

In one embodiment, frequency-domain resampling method 200 generates an output (a second) time series signal that is sampled at the target sampling rate by accessing the linking coefficients and the output dictionary, determining the products of the linking coefficient and set of phase factors for each prominent frequency, linearly combining the determined products to produce a data point for each time point of the output time series signal, and recording the data points as the output time series signal. Process block 235 then completes, and frequency-domain resampling method 200 continues to END block 240, where processing completes. In one embodiment, the functions of process block 235 are performed by resampled time series signal generator 130. In one embodiment, the frequency-domain resampling method 200 produces an output time series signal that approximates what the data values of the input time series signal would have been if the input time series signal had been sampled at the new (second) time points instead of the input (first) time points.

Further Embodiments

In one embodiment of process block 215, as discussed above, a threshold is implemented to differentiate the frequencies that carry information from frequencies that carry noise. In one embodiment of process block 215, the selection of the one or more prominent frequencies also includes selecting the one or more prominent frequencies as a first set of frequencies at which spectral peaks are higher than a threshold in the power spectrum. And, the selection of the one or more prominent frequencies also includes evicting noise elements as a second set of frequencies at which spectral peaks are below the threshold in the power spectrum. In one embodiment, the threshold is a fixed ratio of a highest spectral peak in the power spectrum (as discussed above with reference to the minimum threshold). In one embodiment, the threshold is set at a fixed height (as discussed above with reference to the stopping threshold).

In one embodiment of process block 215, as discussed above, noisy component frequencies are removed from the input (first) time series signal. In one embodiment of process block 215, the selection of the one or more prominent frequencies also includes denoising the input time series signal by removing (or evicting) component frequencies other than the prominent frequencies. Thus, the frequency-domain resampling method 200 operates to denoise the input time series signal and produce a denoised output time series signal. In one embodiment, the frequency domain resampling method 200 incidentally and advantageously denoises the input time series signal. Because only the few K prominent frequencies are retained from the periodogram, the non-prominent component frequencies that carry noise are evicted and disregarded when reconstructing (generating) the output time series signal from the K prominent frequencies. The non-prominent frequencies carry the majority of the noise on the input time series signal, and so removing the non-prominent, noisy component frequencies removes the majority of the noise in the output time series signal. Therefore, the output (interpolated) time series signal [$Rec_{t_1}$, ..., $Rec_{t_N}$] reconstructed from the prominent frequencies is also denoised.

In one embodiment of process block 215, false peaks that appear in the power spectrum at low frequencies are removed from consideration for selection as prominent frequencies. Thus, in one embodiment of process block 215, selecting the one or more prominent frequencies also includes excluding from the selection a low-frequency set of frequencies that occur in a low frequency range of the power spectrum. The low frequency range includes frequencies with periods that exceed a time range covered by the first time series signal. Additional detail on excluding low-frequency peaks is discussed below under the heading "Excluding Low Frequency Peaks".

In one embodiment of process block 210, the power spectrum of power spectral density is a Lomb-Scargle periodogram of the first time series signal. Thus, in one embodiment of process block 210, the generation of the power spectrum of power spectral density for the first time series signal includes generating a Lomb-Scargle periodogram of the first time series signal.

In one embodiment, the first time points at which the first time series signal samples occur are not only inconsistent with the target sampling rate, but the first time points also occur with differing or varying amounts of time between the time points. Thus, for example, the first time points occur at irregular intervals. This may be referred to herein as an "uneven" sampling rate. Frequency-domain resampling method 200 may be used to resample time series with irregularly spaced samples in the frequency domain. In one embodiment of process block 210, the generation of the power spectrum of power spectral density for the first time series signal includes generating a Lomb-Scargle periodogram of the first time series signal in order to accommodate the irregular intervals or uneven sampling rate.

In one embodiment, additional time series signals that are contemporaneous with the first time series signal are also resampled to the target sampling rate. These additional resampled time series signals may be provided to an anomaly detection model along with the second time series signal. The frequency-domain resampling process for the additional time series signals may be similar to frequency-domain resampling method 200. In one embodiment, frequency-domain resampling method 200 generates one or more additional time series signals having the target sampling rate from one or more other time series signals that do not have the target sampling rate to produce a time series database of signals sharing the target sampling rate. The other time series signals that do not have the target sampling rate cover a time range in common with the first time series signal. In one embodiment, following the completion of generating the second time series signal in process block 235, frequency-domain resampling method 200 further provides the time series database as input to an anomaly detection model. In one embodiment, following the completion of process block 235, frequency-domain resampling method 200 further trains a machine learning model to detect anomalies using the time series database. Additional detail on anomaly detection with multiple time series signals is discussed elsewhere herein, for example under the heading "Example Frequency-Domain Resampling Method for Multiple Signals."

In one embodiment, following the completion of generating the second time series signal in process block 235, the frequency-domain resampling method 200 analyzes the second time series signal to detect an anomaly with improved speed of detection. For example, in one embodiment, frequency-domain resampling method 200 analyzes the second time series signal with a machine learning model to detect an anomaly that is present in the first time series signal, wherein the anomaly is detected in the second time series signal at an earlier time point than in the first time series signal. Additional detail on improved speed in anomaly detection due to frequency-domain resampling is discussed elsewhere herein, for example under the heading "Anomaly Detection After Frequency-Domain Resampling."

In one embodiment, following the completion of generating the second time series signal in process block 235, the frequency-domain resampling method 200 analyzes the second time series signal to detect an anomaly with improved accuracy of detection. For example, in one embodiment, frequency-domain resampling method 200 analyzes the second time series signal with a machine learning model to detect an anomaly that is present in the first time series signal. The anomaly is detected by the machine learning model in the second time series signal and not detected by the machine learning model in the first time series signal. Additional detail on improved accuracy in anomaly detection due to frequency-domain resampling is discussed elsewhere herein, for example under the heading "Anomaly Detection After Frequency-Domain Resampling."

In one embodiment, the frequency-domain resampling method 200 enables up-sampling of the input time series signal from the frequency domain, without conversion to the time domain. Up-sampling increases the sampling rate of an input (first) time series signal in the frequency domain by generating new values from the coefficients and sets of phase factors for new (second) time points that are spaced closer together in time than the input (first) time points. In one embodiment, frequency-domain resampling enables a collection of signals with differing sampling rates to be up-sampled to a uniform sampling rate. For example, the sampling rate of all signals in the collection may be up-sampled to a sampling rate of the most rapidly sampled signal in the collection. In one embodiment, the second time series signal at the target sampling rate is an up-sampling of the first time series signal. Thus, in one embodiment of process block 230, generating sets of second phase factors from the prominent frequencies and second time points further includes generating the second time points to be spaced closer together in time than the first time points. This results in the second (output) time series signal having a higher sampling rate than the first (input) time series signal.

In one embodiment, the frequency-domain resampling method 200 also enables down-sampling of the input time series signal from the frequency domain, without conversion to the time domain. Down-sampling decreases the sampling rate of an input (first) time series signal in the frequency domain by generating new values from the coefficients and sets of phase factors for new (second) time points that are spaced farther apart in time than the input (first) time points. In one embodiment, the second time series signal at the target sampling rate is a down-sampling of the first time series signal. Thus, in one embodiment of process block 230, generating sets of second phase factors from the prominent frequencies and second time points further includes generating the second time points to be spaced farther apart in time than the first time points. This results in the second (output) time series signal having a lower sampling rate than the first (input) time series signal.

In one embodiment, each subsequent step of a method commences automatically in response to parsing a signal received or stored data retrieved indicating that the previous step has been performed at least to the extent necessary for the subsequent step to commence. Generally, the signal received or the stored data retrieved indicates completion of the previous step.

—Overview—

ML anomaly detection models consume and process collections of multivariate time series (such as time series databases) from sensors, such as Internet of things (IoT) or other network-connected sensors. Some classes of sensors (and for distributed data acquisition, data acquisition (DAQ) units that aggregate the sensor signals) may sample signals at different sampling rates. This can cause sampling rates to be non-uniform and differ among a collection of time series signals. And, some types of sensors may sample irregularly, for example in response the occurrence of a trigger or interrupt. This can cause a time series signal to have uneven sampling rates where the samples are not distributed evenly through time and differing amounts of time occur between samples.

Generally, machine learning anomaly detection algorithms need uniform and even sampling rates for monitored sensors. Signals may be resampled to create even sampling rates that are uniform among the signals. Resampling generally refers to techniques to interpolate, up-sample, down-sample, or adjust for phase-coherence in time series signals. Crude time-domain-based interpolation techniques may be used to resample in the time domain to produce uniform sampling rates across time series signals from multiple sensor and DAQ classes in order to enable the time series signals to be consumed by ML anomaly detection algorithms. For the increasing preponderance of sensors with high-frequency waveforms—such as vibration, acoustic, infrared thermal imaging, and electromagnetic interference sensors—it is computationally costly to convert signals into the time domain and perform resampling. Further, data volumes from sensors—which are proportional to the number of sensors multiplied by sampling rates for the sensors—have been growing at an exponential pace. The conversion to the time domain and performing resampling operations in the time domain add significant compute overhead.

In one embodiment, the frequency-domain resampling systems and methods presented herein avoid converting signals from the frequency domain to the time domain to make sampling rates even and uniform, and therefore eliminate much of the compute overhead of time-domain-based resampling. In one embodiment, a frequency-domain resampling method employed by a frequency-domain resampling system can resample different non-uniformly and potentially unevenly sampled signals to uniformly and evenly sampled signals at a target sampling rate. In one embodiment, the frequency-domain resampling system described herein employs a novel approach that operates in the frequency domain to achieve even and uniform sampling rates. In one embodiment, the frequency-domain resampling system improves the accuracy of the sensor signals. In one embodiment, the frequency-domain resampling system improves the prognostic performance of the ML anomaly detection, thereby detecting anomalies with higher sensitivity, providing earlier warnings, and with fewer false alarms and fewer missed alarms.

In one embodiment, the frequency-domain resampling method may be applied to multiple time series signals in turn to cause the time series signals to share an even sampling rate (and set of time points) in common. Generally, multivariate ML anomaly detection models cannot be successfully trained to detect anomalies when multiple signals provided as inputs to the model are sampled at differing sampling rates (non-uniformly sampled). And, generally, multivariate ML anomaly detection models are not able to detect anomalies in sets of signals sampled at differing sampling rates. But, in one embodiment, using the frequency-domain resampling method, the signals are resampled over the time range used for training to a same sampling rate that is shared in common over the signals, and the ML anomaly detection model is trained with these resampled signals. Then the signals are resampled over the time range used for testing or surveillance of the signals for anomalies, and the trained ML anomaly detection model is used to identify anomalies in these resampled signals that occur within the time range for testing (surveillance).

In one embodiment, the frequency-domain resampling method interpolates signals from the frequency domain. For example, the frequency-domain resampling method may systematically be performed for all of the time series signals in a database or collection of such signals from sensors. In one embodiment, the processing of each signal includes the following steps: (1) compute the Lomb-Scargle periodogram of the potentially unevenly sampled signal; (2) select the prominent frequencies in the periodogram whose peaks are higher than a specified threshold (this threshold is made adaptive by setting it to be a fixed portion of the highest peak); (3) build a Discrete Fourier Transform (DFT) dictionary consisting of these selected frequencies at time points (or time steps) when there are signal observations; (4) calculate the complex coefficients of these DFT atoms that make up the signal by least squares regression (in particular, least squares regression for complex numbers); (5) build a new DFT dictionary consisting of these frequencies at a new set of time steps determined by the target sampling rate; and (6) linearly combine the products of these DFT atoms with corresponding coefficients to generate frequency-domain resampled signals.

In one embodiment, selection of the prominent frequencies (1) ranks spectral peaks in the periodogram in terms of peak heights and frequency; (2) evicts spectral peaks in the periodogram (regardless of their heights) below a threshold frequency; and (3) incorporates a "stopping threshold" for minimum spectral peak amplitude (height) to ensure that noise elements are evicted.

—Example Frequency-Domain Resampling Method for Multiple Signals—

Figure 4:
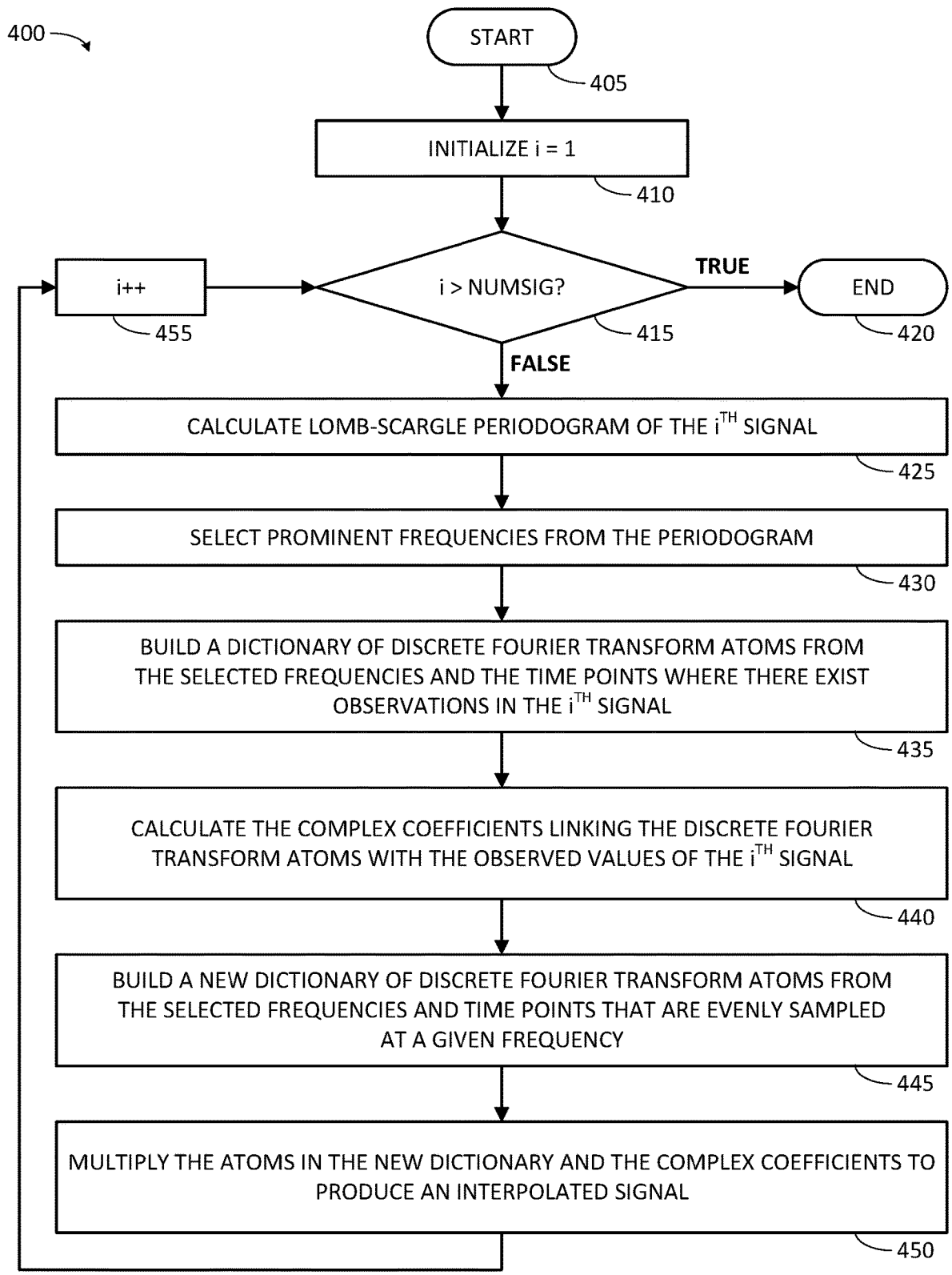
FIG. 4 illustrates an additional example method for resampling of a collection of multiple time series signals in the frequency domain.

FIG. 4 illustrates an additional example method for resampling of a collection of multiple time series signals in the frequency domain, frequency-domain resampling method 400. In one embodiment, frequency-domain resampling method 400 initiates at start block 405 in response to a processor of a computer determining that method 400 should commence. For example, frequency-domain resampling method 400 may initiate in response to determining one or more of: (i) an incoming set of time series signals for resampling to a common sampling rate has been detected; (ii) an instruction to perform frequency-domain resampling method 400 for a set of time series signals has been received; (iii) a user or administrator of frequency-domain resampling system 100 has initiated frequency-domain resampling method 400; (iv) it is currently a time at which frequency-domain resampling method 400 is scheduled to be run; or (v) that frequency-domain resampling method 400 should commence in response to occurrence of some other condition. In one embodiment, the computer is configured by computer-executable instructions to execute components of frequency-domain resampling system 100 in accordance with frequency-domain resampling method 400. Following initiation at start block 405, frequency-domain resampling method 400 continues to process block 410.

The set of time series signals for resampling to a common sampling rate includes a quantity of numSig signals that may be non-uniformly or unevenly sampled. In one embodiment, steps 425-455 of frequency-domain resampling method 400 repeat in a loop to resample each of the numSig time series signals in the set to a target sampling rate. At process block 410, frequency-domain resampling method 400 initializes a counter i to an initial value, for example, i=1. Counter i will be incremented until all signals in the set are processed by steps 425-455 to produce a set of interpolated signals each having the target sampling rate. Processing at process block 410 completes and proceeds to decision block 415.

At decision block 415, frequency-domain resampling method 400 determines whether counter i exceeds numSig, the number of time series signals in the set. Decision block 415 provides a base condition for the loop. Once counter i exceed the number of time series signals in the set, all of the time series signals in the set have been resampled to have the target sampling rate. Frequency-domain resampling method 400 then proceeds to END block 420 where frequency-domain resampling method 400 ends. While counter i does not exceed the number of time series signals in the set, there remains one or more signals for resampling to have the target sampling rate by the steps in the loop. Frequency-domain resampling method 400 then proceeds to process block 425. Although method 400 shows the steps 425-455 as a "while" loop with the check of the base condition at the beginning of the loop, method 400 may also be implemented as a "do-while" with the check of the base condition at the end of the loop.

At process block 425, frequency-domain resampling method 400 calculates the Lomb-Scargle periodogram of the $i^{th}$ signal. In one embodiment, the Lomb-Scargle periodogram of the $i^{th}$ signal is calculated as discussed above with reference to process block 210. Processing continues to process block 430.

At process block 430, frequency-domain resampling method 400 selects the prominent frequencies from the periodogram. In one embodiment, the prominent frequencies are selected from the periodogram as discussed above with reference to process block 215, where the power spectrum is a Lomb-Scargle periodogram. Processing continues to process block 435.

At process block 435, frequency-domain resampling method 400 builds a dictionary of discrete Fourier transform (DFT) atoms from the selected frequencies and the time points where there exist observations in the $i^{th}$ signal. In one embodiment, the DFT atoms are sets of phase factors. The phase factors in a DFT atom for the time points take the form $e^{(j2\pi f_k t_m)}$, where j is the imaginary unit $\sqrt{-1}$, $f_k$ is the selected frequency that the atom is specific to, and $t_m$ is one time point in the set of time points for the existing observations in the $i^{th}$ signal. As used herein, observations may be referred to as data points or samples. The observations in the $i^{th}$ signal exist at the time points in the set of time points. Each DFT atom or set of phase factors is specific to one of the selected frequencies. The dictionary is the set of DFT atoms for all of the selected frequencies. In one embodiment, the DFT atoms in the dictionary are built from the selected frequencies and the time points as discussed above with reference to process block 220 for generating a first set of phase factors. Processing continues to process block 440.

At process block 440, frequency-domain resampling method 400 calculates the complex coefficients linking the DFT atoms with the observed values of the $i^{th}$ signal. The complex coefficients are identified by least squares regression for complex numbers. The least squares regression for complex numbers approximates or fits a curve to the $i^{th}$ signal. The curve is fitted to the $i^{th}$ signal by adjusting the complex coefficients of the functions for the selected frequencies until the square of the distance from the curve to the $i^{th}$ signal at the time points of the $i^{th}$ signal is minimized. The resulting values of the complex coefficients are the complex coefficients that link the DFT atoms with the observed values of the $i^{th}$ signal. In one embodiment, the complex coefficients that link the DFT atoms with the observed values of the h signal are calculated as discussed above with reference to process block 220 for identifying a coefficient. Processing continues to process block 445.

At process block 445, frequency-domain resampling method 400 builds a new dictionary of DFT atoms from the selected frequencies and time points that are evenly sampled at a given frequency (or sampling rate). As discussed above, the DFT atoms are sets of phase factors. The phase factors in a DFT atom for the evenly-sampled time points are of the form $e^{(j2\pi f_k t'_m)}$, where j is the imaginary unit $\sqrt{-1}$, $f_k$ is the selected frequency that the atom is specific to, and $t'_m$ is one of a series of time points for even sample spacing at the given frequency. Each DFT atom is specific to one of the selected frequencies. The new dictionary is the set of DFT atoms (for evenly spaced samples) for all of the selected frequencies. In one embodiment, the DFT atoms in the new dictionary are built from the selected frequencies and the time points that are evenly sampled as discussed above with reference to process block 230 for generating a second set of phase factors. Processing continues to process block 450.

At process block 450, frequency-domain resampling method 400 multiplies the atoms in the new dictionary and the complex coefficients to produce an interpolated signal. In one embodiment, each phase factor in an atom for a frequency is multiplied by the complex coefficient for the frequency. Then the product of phase factor and complex coefficient for each evenly-spaced time point are summed across the selected frequencies to produce an observation or data point at the evenly-spaced time point. Each of these observations may be referred to as interpolated observations. The sequence of observations produced from the phase factors and complex coefficients is the interpolated signal. The interpolated signal is a re-sampling in the frequency domain of the $i^{th}$ signal from one, potentially unevenly-sampled, series of observations, to another, evenly-sampled series of observations. In one embodiment, the interpolated signal is produced as discussed above with reference to process block 235. Processing continues to process block 455.

At process block 455, frequency-domain resampling method 400 increments counter i to indicate that the loop should proceed to the next signal, if any. Processing returns to decision block 415. At process block 415, frequency-domain resampling method 400 determines whether the loop should be repeated or end.

—Anomaly Detection After Frequency-Domain Resampling—

ML modeling may be used as a technique for discovering the onset of anomalies in complex engineering systems in many fields that use sensors to monitor processes. This anomaly discovery may also be referred to as prescriptive or prognostic anomaly detection. In particular, multivariate ML modeling can be used for prescriptive or prognostic anomaly detection. ML-based anomaly detection may be performed, for example, in large-scale time series databases, or for example, for real-time streaming prognostics.

In general, multivariate ML modeling techniques used for anomaly detection predict or estimate what each signal should be or is expected to be based on the other signals in the database. The predicted signal may be referred to as the "estimate". A multivariate ML model is used to make the predictions or estimates. For example, for Signal 1 in a database of N signals, the ML model will compute an estimate for Signal 1 using signals 2 through N. In one embodiment, the multivariate ML model may be a non-linear non-parametric (NLNP) regression algorithm used for multivariate anomaly detection. Such NLNP regression algorithms include neural networks (NNs), Support Vector Machines (SVMs), auto-associative kernel regression (AAKR), and similarity-based modeling (SBM) such as the multivariate state estimation technique (MSET) (including Oracle's proprietary Multivariate State Estimation Technique (MSET2)).

The ML model is trained to produce estimates of what the values of variable should be based on training with a reference set of time series signals that represent normal or correct operation of a monitored asset. The reference set may be a designated range of observations of a set of time series signals, such as the initial range of observations. To train the ML model, the reference set of time series signals for each variable are provided to the ML model. During training, a series of sets of reference values for the variables are provided in turn to the ML model. A set of reference values includes one reference value from each of the reference time series signals in the set at one time point. A set of reference values may also be considered a vector of reference values. A vector includes values for one point in time across a set, collection, or database of time series signals. A configuration of correlation patterns between the variables of the ML model is automatically adjusted based on the reference values so as to cause the ML model to produce accurate estimates for each variable based on inputs to other variables. Sufficient accuracy of estimates to conclude determine the ML model to be sufficiently trained may be determined by residuals being minimized below a training threshold. At the completion of training, the ML model has learned correlation patterns between variables that indicate that the monitored system is operating normally or correctly.

Following training, the ML model may be used to monitor signals. Subtracting each signal from its corresponding estimate gives the residuals or differences between the values of the signal and estimate. Where there is an anomaly in a signal, the measured signal departs from the estimated signal. This causes the residuals to increase, triggering an anomaly alarm. Thus, the residuals are used to detect such anomalies where one or more of the residuals indicates such a departure, for example by becoming consistently excessively large. For example, the presence of an anomaly may be indicated by a sequential probability ratio test (SPRT) analysis of the residuals.

In one embodiment, following frequency-domain resampling of time series signals in a time series database, the time series database is provided as input to an anomaly detection ML model. That is, each signal in the time series database is assigned as an input variable of a multivariate ML model for anomaly detection. In one embodiment, the time series database of frequency-domain resampled time series signals may be used to train the ML model. In one embodiment, the trained ML model may be used to monitor the time series database of frequency-domain resampled time series signals for anomalies.

In one embodiment, frequency-domain resampling of time series signals before training and monitoring improves sensitivity of the ML anomaly detection process. The improved sensitivity enables earlier detection of incipient anomalies. Anomalies are detected at an earlier time point when using time series that have been resampled from the frequency domain as shown and described herein than when using raw, non-resampled signals. Frequency-domain resampling of time series signals removes much noise from the time series signals, producing denoised signals. For example, the output time series signal (that has been resampled from the frequency domain, as discussed above) includes just the content of the prominent frequencies. The prominent frequencies have been determined to be carrying the most information content of the original input time series signal. The noise content carried on the other component frequencies of the input time series signal is disregarded and discarded by frequency-domain resampling. The ML anomaly detection model may be fit more tightly to the resampled time series signal because the ML model need not accommodate as much noise as it would to process the original input time series. Therefore, smaller deviations from expected normal operation of a system that occur earlier in the onset of degradation will be detected.

In one embodiment, frequency-domain resampling of time series signals before training and monitoring improves accuracy of the ML anomaly detection process. The improved accuracy reduces both false alarm probabilities (Type-I error) and missed alarm probabilities (Type-II errors). Due to the de-noising effect of frequency-domain resampling discussed above, very little noise remains on the resampled output time series signal to disturb a normal signal value and cause a false alert, or suppress an anomalous signal value and cause a missed alert.

The advantageous early detection of degradation and increased accuracy of detection of degradation enabled by the frequency-domain resampling systems and methods described herein have been verified by experimentation. The performance of an ML anomaly detection model trained on and monitoring an original set of signals that had not been resampled was compared with the performance of an ML anomaly detection model trained on and monitoring a set of resampled signals that had been resampled from the original set of signals using the frequency-domain resampling method. The original set of signals included a ramp-shaped degradation in one of the signals beginning at 3751 seconds. The ML model trained on and monitoring the non-resampled, original set of signals initially detected the anomaly at 4211 seconds, and missed some detections after the initial detection. The ML model trained on and monitoring the resampled signals initially detected the anomaly at 4171 seconds, and missed no detections after the initial detection. Thus, where there is a degradation, using signals resampled from the frequency domain as shown and described herein can trigger the alarm earlier after the degradation appears. And, where there is a degradation, using signals resampled from the frequency domain as shown and described herein misses fewer detections.

—Excluding Low Frequency Peaks—

Tall peaks or spikes that are tall enough to exceed the threshold may appear in the power spectrum at low frequencies. These peaks are not meaningful where the peak is at a period that is greater than the time covered by the input time series (or, for streaming inputs, greater than the length of a moving window of the time series). These peaks are likely due to tilt or slope in the data points of a time series signal. In other words, the data may exhibit an upward or downward slope over the length of the input time series signal, which is then falsely interpreted as periodic activity during the generation of the power spectrum. This slope in the data appears in the power spectrum as periodic activity with a low frequency that is at or below one divided by the time range covered by the input time series signal (1/TimeRangeOfSignal). In other words, there is a peak in the power spectrum at a period that is greater than or equal to the time range covered by the input time series signal. These low-frequency (high-period) peaks are therefore false peaks that do not truly indicate any periodic behavior. Tilted or sloped data values can trigger false alerts in subsequent ML anomaly detection analysis.

In one embodiment, in the selection of prominent frequencies from the power spectrum, high peaks in the lowest-frequency portion of the periodogram are ignored. Disregarding these peaks eliminates, solves, and/or avoids the challenge presented to multivariate AD algorithms by tilted or sloped data in a time series. By ignoring or evicting the false peaks when resampling from the frequency domain as described herein, the tilt or slope is removed and not present in the resampled signal.

In one embodiment of process block 215, the false peaks are evicted following the identification of the peaks by frequency and magnitude, and before setting the value of the threshold based on a highest peak. In one embodiment of process block 215, the false peaks are evicted before the peaks are sorted in order of magnitude. In one embodiment, a frequency floor is calculated. The frequency floor may be one divided by the time range covered by the input time series signal (1/TimeRangeOfSignal). Peaks having frequencies lower than the frequency floor are removed from subsequent consideration. For example, a peak having a frequency lower than the frequency floor may be removed or evicted by determining that the frequency of the peak is lower than the frequency floor, and then deleting the low-frequency peak from the set of peaks. Thus, the false low-frequency peaks will not be identified as the highest peak for the purposes of setting the minimum threshold for prominence. And, the false low-frequency peaks will not be selected as prominent peaks, and will not be used by the frequency-domain resampling method to generate an output time series signal. In this manner, tilt or slope is removed from the output time series signal.

—Some Selected Advantages—

In one embodiment, the frequency-domain resampling systems and methods described herein enables frequency-domain resampling of time series signals to a same sampling rate that is both evenly sampled at an interval, and to a rate that is uniform across the collection of signals to be examined for anomalies. This enables multivariate ML anomaly detection algorithms to examine and detect anomalies in the resampled time series signals.

In one embodiment, the frequency-domain resampling systems and methods described herein enables resampling to be performed in or from the frequency domain, without performing a conversion to the time domain. This reduces compute overhead.

In one embodiment, the frequency-domain resampling systems and methods described herein improve over existing resampling techniques by additionally denoising signals. The denoising is incidental to the frequency-domain resampling process, and advantageously leads to the earlier trigger of alarms after the onset of degradation, and with fewer false/missing alarms in the anomaly detection.

In one embodiment, the frequency-domain resampling systems and methods described herein render existing ML surveillance systems more accurate.

In one embodiment, the frequency-domain resampling systems and methods described herein enables prognostic anomaly discovery systems to have a lower Type-I error probability (i.e., fewer false alerts) than prognostic anomaly discovery systems without frequency-domain resampling systems and methods described herein. In one embodiment, the frequency-domain resampling systems and methods described herein enables prognostic anomaly discovery systems to have a lower Type-II error probability (i.e., fewer missed alerts) than prognostic anomaly discovery systems without frequency-domain resampling systems and methods described herein.

In one embodiment, the frequency-domain resampling methods and systems described herein need not analyze noise on a time series signal in order to re-sample the time series signal to a target sampling rate. Instead, in one embodiment, frequencies that appear to be noise content are excluded by the step of selecting prominent frequencies in the periodogram. This reduces compute overhead.

In one embodiment, the frequency-domain resampling methods and systems described herein are able to analyze unevenly sampled time series signals that do not have data points that are evenly spaced in time. Other methods to resample signals may be able only to resample from one even sampling rate to another even sampling rate, and may be unable to resample time series signals that are unevenly sampled.

In one embodiment, the frequency-domain resampling methods and systems described herein are able to up-sample the unevenly sampled signals or non-uniformly sampled signals (signals sampled at various sampling rates) to a higher sampling rate that is the same for all of the resampled signals. In one embodiment, the up-sampling that performed by the frequency-domain resampling methods and systems described herein may match or even exceed the sampling rates of the most rapidly sampled signal in a collection. Thus, in one embodiment, the frequency-resampling methods and systems can accurately interpolate—that is, create data points in the time series signal that are not originally observed—at any resolution.

In one embodiment, the frequency-domain resampling methods and systems may be particularly useful for monitoring sensor signals in data centers. In data centers, timestamps in servers may become significantly out of synchronization due to variable drifts of multiple internal software clocks. In one embodiment, the lack of synchronization are corrected by application of the frequency-domain resampling methods and systems. Also, many server-relevant signals are interrupt driven to generate a value only on occurrence of a particular interrupt condition, and therefore may have uneven sampling rates. In one embodiment, the uneven sampling rates are corrected by application of the frequency-domain resampling methods and systems.

In one embodiment, the improvements over time-domain based interpolation offered by frequency-based resampling may be realized without requiring hardware upgrades anywhere in the computing systems used to monitor the sensor signals. This renders the frequency-based resampling method immediately backward compatible with existing sensor monitoring systems.

In one embodiment, the frequency-domain resampling methods scales to any number of signals with no loss of any of the advantages discussed herein.

—Cloud or Enterprise Embodiments—

In one embodiment, the present system (such as frequency-domain resampling system 100) is a computing/data processing system including a computing application or collection of distributed computing applications for access and use by other client computing devices that communicate with the present system over a network. In one embodiment, frequency-domain resampling system 100 is a component of a time series data service that is configured to gather, serve, and execute operations on time series data. The applications and computing system may be configured to operate with or be implemented as a cloud-based network computing system, an infrastructure-as-a-service (IAAS), platform-as-a-service (PAAS), or software-as-a-service (SAAS) architecture, or other type of networked computing solution. In one embodiment the present system provides at least one or more of the functions disclosed herein and a graphical user interface to access and operate the functions. In one embodiment frequency-domain resampling system 100 is a centralized server-side application that provides at least the functions disclosed herein and that is accessed by many users by way of computing devices/terminals communicating with the computers of frequency-domain resampling system 100 (functioning as one or more servers) over a computer network. In one embodiment frequency-domain resampling system 100 may be implemented by a server or other computing device configured with hardware and software to implement the functions and features described herein.

In one embodiment, the components of frequency-domain resampling system 100 may be implemented as sets of one or more software modules executed by one or more computing devices specially configured for such execution. In one embodiment, the components of frequency-domain resampling system 100 are implemented on one or more hardware computing devices or hosts interconnected by a data network. For example, the components of frequency-domain resampling system 100 may be executed by network-connected computing devices of one or more compute hardware shapes, such as central processing unit (CPU) or general-purpose shapes, dense input/output (I/O) shapes, graphics processing unit (GPU) shapes, and high-performance computing (HPC) shapes.

In one embodiment, the components of frequency-domain resampling system 100 intercommunicate by electronic messages or signals. These electronic messages or signals may be configured as calls to functions or procedures that access the features or data of the component, such as for example application programming interface (API) calls. In one embodiment, these electronic messages or signals are sent between hosts in a format compatible with transmission control protocol/internet protocol (TCP/IP) or other computer networking protocol. Components of frequency-domain resampling system 100 may (i) generate or compose an electronic message or signal to issue a command or request to another component, (ii) transmit the message or signal to other components of frequency-domain resampling system 100, (iii) parse the content of an electronic message or signal received to identify commands or requests that the component can perform, and (iv) in response to identifying the command or request, automatically perform or execute the command or request. The electronic messages or signals may include queries against databases. The queries may be composed and executed in query languages compatible with the database and executed in a runtime environment compatible with the query language.

In one embodiment, remote computing systems may access information or applications provided by frequency-domain resampling system 100, for example through a web interface server. In one embodiment, the remote computing system may send requests to and receive responses from frequency-domain resampling system 100. In one example, access to the information or applications may be effected through use of a web browser on a personal computer or mobile device. In one example, communications exchanged with frequency-domain resampling system 100 may take the form of remote representational state transfer (REST) requests using JavaScript object notation (JSON) as the data interchange format for example, or simple object access protocol (SOAP) requests to and from XML servers. The REST or SOAP requests may include API calls to components of frequency-domain resampling system 100.

—Software Module Embodiments—

In general, software instructions are designed to be executed by one or more suitably programmed processors accessing memory. These software instructions may include, for example, computer-executable code and source code that may be compiled into computer-executable code. These software instructions may also include instructions written in an interpreted programming language, such as a scripting language.

In a complex system, such instructions may be arranged into program modules with each such module performing a specific task, process, function, or operation. The entire set of modules may be controlled or coordinated in their operation by an operating system (OS) or other form of organizational platform.

In one embodiment, one or more of the components described herein are configured as modules stored in a non-transitory computer readable medium. The modules are configured with stored software instructions that when executed by at least a processor accessing memory or storage cause the computing device to perform the corresponding function(s) as described herein.

—Computing Device Embodiment—

Figure 5:
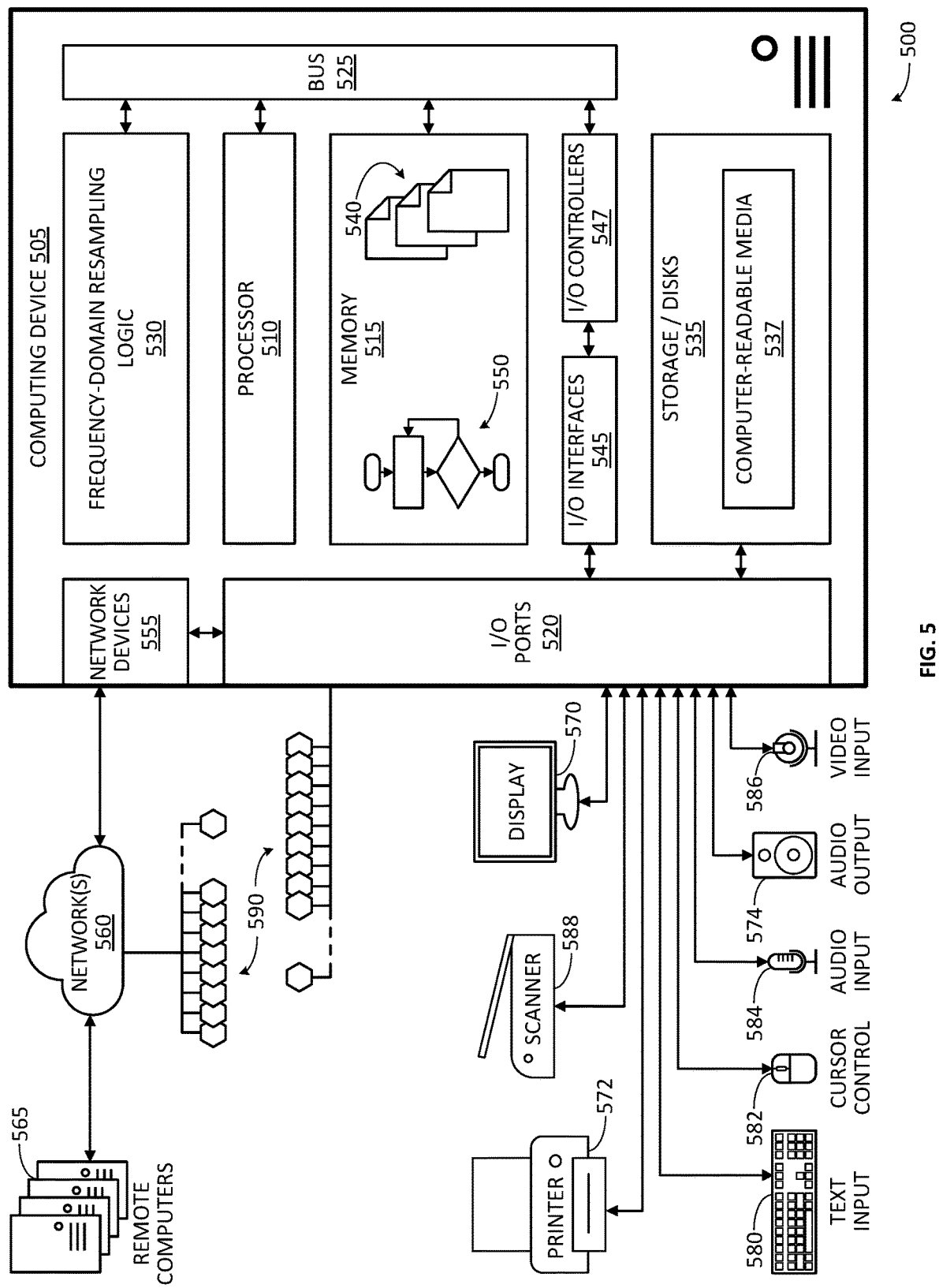
FIG. 5 illustrates an embodiment of a computing system (or computer system) configured with the example systems and/or methods disclosed.

FIG. 5 illustrates an example computing system 500 (which may also be referred to as a computer system) including an example computing device that is configured and/or programmed as a special purpose computing device with one or more of the example systems and methods described herein, and/or equivalents. The example computing device may be a computer 505 that includes at least one hardware processor 510, a memory 515, and input/output ports 520 operably connected by a bus 525. In one example, the computer 505 may include frequency-domain resampling logic 530 configured to facilitate frequency-domain analytical resampling of time series similar to logic, systems, and methods shown and described with reference to FIGS. 1, 2, 3 and 4.

In different examples, the logic 530 may be implemented in hardware, a non-transitory computer-readable medium 537 with stored instructions, firmware, and/or combinations thereof. While the logic 530 is illustrated as a hardware component attached to the bus 525, it is to be appreciated that in other embodiments, the logic 530 could be implemented in the processor 510, stored in memory 515, or stored in disk 535.

In one embodiment, logic 530 or the computer is a means (e.g., structure: hardware, non-transitory computer-readable medium, firmware) for performing the actions described. In some embodiments, the computing device may be a server operating in a cloud computing system, a server configured in a Software as a Service (SaaS) architecture, a smart phone, laptop, tablet computing device, and so on.

The means may be implemented, for example, as an ASIC programmed to resample time series from the frequency domain. The means may also be implemented as stored computer executable instructions that are presented to computer 505 as data 540 that are temporarily stored in memory 515 and then executed by processor 510.

Logic 530 may also provide means (e.g., hardware, non-transitory computer-readable medium that stores executable instructions, firmware) for resampling time series from the frequency domain.

Generally describing an example configuration of the computer 505, the processor 510 may be a variety of various processors including dual microprocessor and other multi-processor architectures. A memory 515 may include volatile memory and/or non-volatile memory. Non-volatile memory may include, for example, ROM, PROM, and so on. Volatile memory may include, for example, RAM, SRAM, DRAM, and so on.

A storage disk 535 may be operably connected to the computer 505 via, for example, an input/output (I/O) interface (e.g., card, device) 545 and an input/output port 520 that are controlled by at least an input/output (I/O) controller 547. The disk 535 may be, for example, a magnetic disk drive, a solid-state disk drive, a floppy disk drive, a tape drive, a Zip drive, a flash memory card, a memory stick, and so on. Furthermore, the disk 535 may be a CD-ROM drive, a CD-R drive, a CD-RW drive, a DVD ROM, and so on. The memory 515 can store a process 550 and/or a data 540, for example. The disk 535 and/or the memory 515 can store an operating system that controls and allocates resources of the computer 505.

The computer 505 may interact with, control, and/or be controlled by input/output (I/O) devices via the input/output (I/O) controller 547, the I/O interfaces 545, and the input/output ports 520. Input/output devices may include, for example, one or more displays 570, printers 572 (such as inkjet, laser, or 3D printers), audio output devices 574 (such as speakers or headphones), text input devices 580 (such as keyboards), cursor control devices 582 for pointing and selection inputs (such as mice, trackballs, touch screens, joysticks, pointing sticks, electronic styluses, electronic pen tablets), audio input devices 584 (such as microphones or external audio players), video input devices 586 (such as video and still cameras, or external video players), image scanners 588, video cards (not shown), disks 535, network devices 555, and so on. The input/output ports 520 may include, for example, serial ports, parallel ports, and USB ports.

The computer 505 can operate in a network environment and thus may be connected to the network devices 555 via the I/O interfaces 545, and/or the I/O ports 520. Through the network devices 555, the computer 505 may interact with a network 555. Through the network, the computer 505 may be logically connected to remote computers 565. Networks with which the computer 505 may interact include, but are not limited to, a LAN, a WAN, and other networks.

In one embodiment, the computer may be connected to sensors 590 through I/O ports 520 or networks 560 in order to receive information about physical states of monitored machines, devices, systems, or facilities (collectively referred to as "assets"). In one embodiment, sensors 590 are configured to monitor physical phenomena occurring in or around an asset. The assets generally include any type of machinery or facility with components that perform measurable activities. In one embodiment, sensors 590 may be operably connected or affixed to assets or otherwise configured to detect and monitor physical phenomena occurring in or around the asset. The sensors 590 may be network-connected sensors for monitoring any type of physical phenomena. The network connection of the sensors 590 and networks 560 may be wired or wireless.

In one embodiment, computer 505 is configured with logic, such as software modules, to collect readings from sensors 590 and store them as observations in a time series data structure such as a time series database. In one embodiment, the computer 505 polls sensors 590 to retrieve sensor telemetry readings. In one embodiment, the computer 590 passively receives sensor telemetry readings actively transmitted by sensors 590. In one embodiment, the computer 505 receives one or more databases of previously collected observations of sensors 590, for example from storage 535 or from remote computers 565.

Definitions and Other Embodiments

No action or function described or claimed herein is performed by the human mind. An interpretation that any action or function can be performed in the human mind is inconsistent with and contrary to this disclosure.

In another embodiment, the described methods and/or their equivalents may be implemented with computer executable instructions. Thus, in one embodiment, a non-transitory computer readable/storage medium is configured with stored computer executable instructions of an algorithm/executable application that when executed by a machine(s) cause the machine(s) (and/or associated components) to perform the method. Example machines include but are not limited to a processor, a computer, a server operating in a cloud computing system, a server configured in a Software as a Service (SaaS) architecture, a smart phone, and so on). In one embodiment, a computing device is implemented with one or more executable algorithms that are configured to perform any of the disclosed methods.

In one or more embodiments, the disclosed methods or their equivalents are performed by either: computer hardware configured to perform the method; or computer instructions embodied in a module stored in a non-transitory computer-readable medium where the instructions are configured as an executable algorithm configured to perform the method when executed by at least a processor of a computing device.

While for purposes of simplicity of explanation, the illustrated methodologies in the figures are shown and described as a series of blocks of an algorithm, it is to be appreciated that the methodologies are not limited by the order of the blocks. Some blocks can occur in different orders and/or concurrently with other blocks from that shown and described. Moreover, less than all the illustrated blocks may be used to implement an example methodology. Blocks may be combined or separated into multiple actions/components. Furthermore, additional and/or alternative methodologies can employ additional actions that are not illustrated in blocks. The methods described herein are limited to statutory subject matter under 35 U.S.C § 101.

The following includes definitions of selected terms employed herein. The definitions include various examples and/or forms of components that fall within the scope of a term and that may be used for implementation. The examples are not intended to be limiting. Both singular and plural forms of terms may be within the definitions.

References to "one embodiment", "an embodiment", "one example", "an example", and so on, indicate that the embodiment(s) or example(s) so described may include a particular feature, structure, characteristic, property, element, or limitation, but that not every embodiment or example necessarily includes that particular feature, structure, characteristic, property, element or limitation. Furthermore, repeated use of the phrase "in one embodiment" does not necessarily refer to the same embodiment, though it may.

A "data structure", as used herein, is an organization of data in a computing system that is stored in a memory, a storage device, or other computerized system. A data structure may be any one of, for example, a data field, a data file, a data array, a data record, a database, a data table, a graph, a tree, a linked list, and so on. A data structure may be formed from and contain many other data structures (e.g., a database includes many data records). Other examples of data structures are possible as well, in accordance with other embodiments.

"Computer-readable medium" or "computer storage medium", as used herein, refers to a non-transitory medium that stores instructions and/or data configured to perform one or more of the disclosed functions when executed. Data may function as instructions in some embodiments. A computer-readable medium may take forms, including, but not limited to, non-volatile media, and volatile media. Non-volatile media may include, for example, optical disks, magnetic disks, and so on. Volatile media may include, for example, semiconductor memories, dynamic memory, and so on. Common forms of a computer-readable medium may include, but are not limited to, a floppy disk, a flexible disk, a hard disk, a magnetic tape, other magnetic medium, an application specific integrated circuit (ASIC), a programmable logic device, a compact disk (CD), other optical medium, a random access memory (RAM), a read only memory (ROM), a memory chip or card, a memory stick, solid state storage device (SSD), flash drive, and other media from which a computer, a processor or other electronic device can function with. Each type of media, if selected for implementation in one embodiment, may include stored instructions of an algorithm configured to perform one or more of the disclosed and/or claimed functions. Computer-readable media described herein are limited to statutory subject matter under 35 U.S.C § 101.

"Logic", as used herein, represents a component that is implemented with computer or electrical hardware, a non-transitory medium with stored instructions of an executable application or program module, and/or combinations of these to perform any of the functions or actions as disclosed herein, and/or to cause a function or action from another logic, method, and/or system to be performed as disclosed herein. Equivalent logic may include firmware, a microprocessor programmed with an algorithm, a discrete logic (e.g., ASIC), at least one circuit, an analog circuit, a digital circuit, a programmed logic device, a memory device containing instructions of an algorithm, and so on, any of which may be configured to perform one or more of the disclosed functions. In one embodiment, logic may include one or more gates, combinations of gates, or other circuit components configured to perform one or more of the disclosed functions. Where multiple logics are described, it may be possible to incorporate the multiple logics into one logic. Similarly, where a single logic is described, it may be possible to distribute that single logic between multiple logics. In one embodiment, one or more of these logics are corresponding structures associated with performing the disclosed and/or claimed functions. Choice of which type of logic to implement may be based on desired system conditions or specifications. For example, if greater speed is a consideration, then hardware would be selected to implement functions. If a lower cost is a consideration, then stored instructions/executable applications would be selected to implement the functions. Logic is limited to statutory subject matter under 35 U.S.C. § 101.

An "operable connection", or a connection by which entities are "operably connected", is one in which signals, physical communications, and/or logical communications may be sent and/or received. An operable connection may include a physical interface, an electrical interface, and/or a data interface. An operable connection may include differing combinations of interfaces and/or connections sufficient to allow operable control. For example, two entities can be operably connected to communicate signals to each other directly or through one or more intermediate entities (e.g., processor, operating system, logic, non-transitory computer-readable medium). Logical and/or physical communication channels can be used to create an operable connection.

"User", as used herein, includes but is not limited to one or more persons, computers or other devices, or combinations of these.

While the disclosed embodiments have been illustrated and described in considerable detail, it is not the intention to restrict or in any way limit the scope of the appended claims to such detail. It is, of course, not possible to describe every conceivable combination of components or methodologies for purposes of describing the various aspects of the subject matter. Therefore, the disclosure is not limited to the specific details or the illustrative examples shown and described. Thus, this disclosure is intended to embrace alterations, modifications, and variations that fall within the scope of the appended claims, which satisfy the statutory subject matter requirements of 35 U.S.C. § 101.

To the extent that the term "includes" or "including" is employed in the detailed description or the claims, it is intended to be inclusive in a manner similar to the term "comprising" as that term is interpreted when employed as a transitional word in a claim.

To the extent that the term "or" is used in the detailed description or claims (e.g., A or B) it is intended to mean "A or B or both". When the applicants intend to indicate "only A or B but not both" then the phrase "only A or B but not both" will be used. Thus, use of the term "or" herein is the inclusive, and not the exclusive use.

What is claimed is:

1. A computer-implemented method, comprising:
generating a power spectrum for a first time series signal, wherein the first time series signal is sampled at first time points that are inconsistent with a target sampling rate;
selecting one or more prominent frequencies from the power spectrum, by:
  (i) selecting as the one or more prominent frequencies a first set of frequencies at which spectral peaks that are higher than a threshold occur in the power spectrum; and
  (ii) evicting as noise components a second set of frequencies at which spectral peaks that are below the threshold occur in the power spectrum;
generating sets of first phase factors from the prominent frequencies and the first time points, wherein each of the sets of first phase factors maps one of the prominent frequencies to a frequency domain at the first time points;
identifying coefficients that relate the sets of first phase factors to values of the first time series signal at the first time points;
generating sets of second phase factors from the prominent frequencies and second time points, wherein the second time points are consistent with the target sampling rate, and wherein each of the sets of second phase factors maps one of the prominent frequencies to the frequency domain at the second time points;
generating a second time series signal that is resampled at the target sampling rate by generating new values at the second time points from the coefficients and sets of second phase factors; and
detecting an anomaly in the second time series signal using a machine learning model at an earlier time point than the machine learning model would detect the anomaly in the first time series signal.

2. The computer-implemented method of claim 1, wherein the threshold is a fixed ratio of a highest spectral peak in the power spectrum.

3. The computer-implemented method of claim 1, wherein selecting the one or more prominent frequencies further comprises excluding from the selection a low-frequency set of frequencies that occur in a low frequency range of the power spectrum, wherein the low frequency range includes frequencies with periods that exceed a time range covered by the first time series signal.

4. The computer-implemented method of claim 1, wherein generating the power spectrum for the first time series signal further comprises generating a Lomb-Scargle periodogram of the first time series signal.

5. The computer-implemented method of claim 1, wherein the first time points occur at irregular intervals.

6. The computer-implemented method of claim 1, further comprising:
generating one or more additional time series signals having the target sampling rate from one or more other time series signals that do not have the target sampling rate to produce a time series database of signals sharing the target sampling rate, wherein the other time series signals that do not have the target sampling rate cover a time range in common with the first time series signal; and
providing the time series database as input to an anomaly detection model.

7. The computer-implemented method of claim 1, wherein the selecting the one or more prominent frequencies denoises the second time series signal with respect to the first time series signal.

8. The computer-implemented method of claim 1, wherein the generating the power spectrum for the first time series signal further comprises generating a non-uniform discrete Fourier transform of the first time series signal.

9. The computer-implemented method of claim 1, wherein the selecting one or more prominent frequencies from the power spectrum further comprises applying a stopping threshold below which all frequencies are evicted, wherein the stopping threshold is a non-relative magnitude value.

10. The computer-implemented method of claim 1, wherein the detecting an anomaly in the second time series signal further comprises:
determining residuals between actual values of the second time series signal and machine learning model estimated values of the second time series signal further comprises generating a non-uniform discrete Fourier transform of the first time series signal; and
analyzing the residuals sequentially to detect the anomaly.

11. A non-transitory computer-readable medium that includes stored thereon computer-executable instructions that when executed by at least a processor of a computer system cause the computer system to:
generate a power spectrum for a first time series signal, wherein the first time series signal is sampled at first time points that are inconsistent with a target sampling rate;
select one or more prominent frequencies from the power spectrum, by:
  (i) selecting as the one or more prominent frequencies a first set of frequencies at which spectral peaks that are higher than a threshold occur in the power spectrum; and
  (ii) evicting as noise components a second set of frequencies at which spectral peaks that are below the threshold occur in the power spectrum;
generate sets of first phase factors from the prominent frequencies and the first time points, wherein each of the sets of first phase factors maps one of the prominent frequencies to a frequency domain at the first time points;

identify coefficients that relate the sets of first phase factors to values of the first time series signal at the first time points;

generate sets of second phase factors from the prominent frequencies and second time points, wherein the second time points are consistent with the target sampling rate, and wherein each of the sets of second phase factors maps one of the prominent frequencies to the frequency domain at the second time points;

generate a second time series signal that is resampled at the target sampling rate by generating new values at the second time points from the coefficients and sets of second phase factors; and correctly detect an anomaly in the second time series signal using a machine learning model where the machine learning model would not detect the anomaly in the first time series signal.

12. The non-transitory computer-readable medium of claim 11, wherein the threshold is set at a fixed height.

13. The non-transitory computer-readable medium of claim 11, wherein the instructions to select one or more prominent frequencies from the power spectrum further cause the computer system to exclude from the selection of the one or more prominent frequencies a low-frequency set of frequencies that occur in a low frequency range of the power spectrum, wherein the low frequency range includes frequencies with periods that exceed a time range covered by the input time series signal.

14. The non-transitory computer-readable medium of claim 11, wherein the first time points occur at irregular intervals, and wherein the instructions to generate the power spectrum for the first time series signal further cause the computer system to generate a Lomb-Scargle periodogram of the first time series signal.

15. The non-transitory computer-readable medium of claim 11, wherein the instructions further cause the computer system to:

generate one or more additional time series signals having the target sampling rate from one or more other time series signals that do not have the target sampling rate to produce a time series database of signals sharing the target sampling rate, wherein the other time series signals that do not have the target sampling rate cover a time range in common with the first time series signal; and train a machine learning model to detect anomalies using the time series database.

16. A computing system, comprising:
at least one processor;
at least one memory operably connected to the processor; and
a non-transitory computer readable medium including instructions stored thereon that when executed by at least the processor cause the computing system to:

generate a power spectrum for a first time series signal, wherein the first time series signal is sampled at first time points that are inconsistent with a target sampling rate;

select one or more prominent frequencies from the power spectrum by removing frequencies other than the prominent frequencies;

generate sets of first phase factors from the prominent frequencies and the first time points, wherein each of the sets of first phase factors maps one of the prominent frequencies to a frequency domain at the first time points;

identify coefficients that describe the relationship between the sets of first phase factors and values of the first time series signal at the first time points;

generate sets of second phase factors from the prominent frequencies and second time points, wherein the second time points are consistent with the target sampling rate, and wherein each of the sets of second phase factors maps one of the prominent frequencies to the frequency domain at the second time points;

generate a second time series signal that is resampled at the target sampling rate by generating new values at the second time points from the coefficients and sets of second phase factors; and correctly detect an anomaly in the second time series signal using a machine learning model at an earlier time point than the machine learning model would detect the anomaly in the first time series signal.

17. The computing system of claim 16, wherein the instructions to select one or more prominent frequencies from the power spectrum further cause the computing system to exclude from the selection of the one or more prominent frequencies a low-frequency set of frequencies that occur in a low frequency range of the power spectrum, wherein the low frequency range includes frequencies with periods that exceed a time range covered by the input time series signal.

18. The computing system of claim 16, wherein the second time series signal at the target sampling rate is a down-sampling of the first time series signal, wherein the instructions to generate sets of second phase factors from the prominent frequencies and second time points further cause the computing system to generate the second time points to be spaced farther apart in time than the first time points.

19. The computing system of claim 16, wherein the second time series signal at the target sampling rate is an up-sampling of the first time series signal, wherein the instructions to generate sets of second phase factors from the prominent frequencies and second time points further cause the computing system to generate the second time points to be spaced closer together in time than the first time points.

20. The computing system of claim 16, wherein the anomaly is present in the first time series signal.

* * * * *